(12) United States Patent
Huang

(10) Patent No.: US 11,306,407 B2
(45) Date of Patent: Apr. 19, 2022

(54) METHODS FOR ELECTRODEPOSITION

(71) Applicant: THE BOARD OF TRUSTEES OF THE UNIVERSITY OF ALABAMA, Tuscaloosa, AL (US)

(72) Inventor: Qiang Huang, Tuscaloosa, AL (US)

(73) Assignee: The Board of Trustees of the University of Alabama, Tuscaloosa, AL (US)

( * ) Notice: Subject to any disclaimer, the term of this patent is extended or adjusted under 35 U.S.C. 154(b) by 56 days.

(21) Appl. No.: 16/722,237

(22) Filed: Dec. 20, 2019

(65) Prior Publication Data

US 2020/0199768 A1    Jun. 25, 2020

Related U.S. Application Data

(60) Provisional application No. 62/783,371, filed on Dec. 21, 2018.

(51) Int. Cl.
| | |
|---|---|
| *C25D 3/12* | (2006.01) |
| *C25D 3/54* | (2006.01) |
| *C25D 5/50* | (2006.01) |
| *C25D 9/02* | (2006.01) |
| *H01L 39/24* | (2006.01) |
| *C25D 5/00* | (2006.01) |
| *C25D 5/10* | (2006.01) |

(52) U.S. Cl.
CPC ............... *C25D 3/12* (2013.01); *C25D 3/54* (2013.01); *C25D 5/10* (2013.01); *C25D 5/50* (2013.01); *C25D 5/605* (2020.08); *C25D 5/611* (2020.08); *C25D 5/617* (2020.08); *C25D 5/619* (2020.08); *C25D 5/625* (2020.08); *C25D 5/627* (2020.08); *C25D 9/02* (2013.01); *H01L 39/2403* (2013.01)

(58) Field of Classification Search
None
See application file for complete search history.

(56) References Cited

U.S. PATENT DOCUMENTS

| | | | | |
|---|---|---|---|---|
| 2005/0126922 | A1* | 6/2005 | Narita | C25D 3/56 205/238 |
| 2005/0173255 | A1* | 8/2005 | Bokisa | C25D 3/562 205/255 |
| 2010/0167084 | A1* | 7/2010 | Bhattacharya | H01L 31/03926 428/637 |

OTHER PUBLICATIONS

Stephens et al. "Ductility Mechanisms and Superplasticity in Chromium Alloys", NASA technical notes, (Year: 1968).*
Andreev et al. Influence of ion solvation on the properties of electrolyte solutions, J. Phys. Chem. B 212 (2018) 4029-4034.
Aziz et al. Molybdenum-rhenium superconducting suspended nanostructures, Appl. Phys. Lett. 104 (2014), 233102.
Barends et al. Superconducting quantum circuits at the surface code threshold for fault tolerance, Nature, 2014, 508(7497), 500.
Blais et al. Cavity quantum electrodynamics for superconducting electrical circuits: An architecture for quantum computation, Physical Review A, 2004, 69(6), 062320.
Brongersma et al. Grain growth, stress, and impurities in electroplated copper, J. Mater. Res. 17 (2002) 582-589.

(Continued)

*Primary Examiner* — Wojciech Haske
(74) *Attorney, Agent, or Firm* — Meunier Carlin & Curfman LLC

(57) ABSTRACT

Methods for electrodeposition using aqueous electrolytes where water molecules are depleted are described herein. Methods of electrodepositing superconducting thin films from aqueous electrolytes where water molecules are depleted are also described herein.

18 Claims, 18 Drawing Sheets

(56) References Cited

OTHER PUBLICATIONS

Cabral et al. Role of stress relief in the hexagonal-close-packed to face-centered-cubic phase transformation in cobalt thin films, Journal of Vacuum Science & Technology A: Vacuum, Surfaces, and Films, 11 (1993) 1435-1440.
Cao et al. Communication—A Mechanistic Study on Electrodeposition of Rhenium from Acidic Solution of Ammonium Perrhenate, Journal of The Electrochemical Society, 2017, 164(13), D825.
Chowdhury et al. Stress Evolution in Electrodeposited Copper Metallization during Room-Temperature Aging, ECS Transactions, 1 (2006) 93-103.
Chu et al. Superconductivity of Re—Os, Re—Ru, Ru—Os, and Re—W hcp alloy systems and slightly doped Re, Physical Review B, 3 (1971) 3757-3762.
Coustan et al. Electrochemical behavior of platinum, gold and glassy carbon electrodes in water-in-salt electrolyte, Electrochemistry Communications, 2017, 77, 89.
Daunt et al. Superconductivity of rhenium, Physical Review, 88 (1952) 309-311.
Du et al. Structural and dynamic properties of concentrated alkali halide solutions: a molecular dynamics simulation study, The Journal of Physical Chemistry B, 2007, 111(1), 209.
Fink et al. Rhenium Plating, Transactions of The Electrochemical Society, 1934, 66(1), 471.
Foxen et al. Qubit compatible superconducting interconnects, Quantum Science and Technology, 2017, 3(1), 014005.
Frieberthauser et al. Electrical Properties and Superconductivity of Rhenium and Molybdenum Films, Journal of Vacuum Science and Technology, 1970, 7(4), 485.
Friedman et al. The coordination geometry of water in some salt hydrates, Journal of Solution Chemistry, 5 (1976) 445-455.
Gavaler et al. A-15 structure Mo—Re superconductor, Applied Physics Letters, 21 (1972) 179-180.
Ge et al. Linking electronic and molecular structure: insight into aqueous chloride solvation, Physical Chemistry Chemical Physics, 15 (2013) 13169-13183.
Huang et al. Electrodeposition of Rhenium with Suppressed Hydrogen Evolution from Water-in-salt Electrolyte, Electrochemistry Communications, 2018, 93, 53-56.
Huang et al. Single-Crystalline Germanium Thin Films by Electrodeposition and Solid-Phase Epitaxy, Electrochemical and Solid-State Letters, 10 (2007) D124-D126.
Ioffe et al. Environmentally decoupled sds-wave Josephson junctions for quantum computing, Nature, 1999, 398(6729), 679.
Kelly et al. State preservation by repetitive error detection in a superconducting quantum circuit, Nature, 2015, 519(7541), 66.
Marcus, Effect of Ions on the Structure of Water: Structure Making and Breaking, Chemical Reviews, 2009, 109(3), 1346.
Nakahara et al. Vacancy-Induced Plastic Deformation in Electrodeposited Copper Films, Journal of The Electrochemical Society, 154 (2007) D145-D150.
Pappas et al. Enhanced superconducting transition temperature in electroplated rhenium, Applied Physics Letters, 2018, 112(18), 182601.
Semenov et al. Quantum detection by current carrying superconducting film, Physica C: Superconductivity, 2001, 351(4), 349.
Sun et al. "Water-in-Salt" electrolyte enabled $LiMn_2O_4/TiS_2$ Lithium-ion batteries, Electrochemistry Communications, 2017, 82, 71.
Suo et al. "Water-in-salt" electrolyte enables high-voltage aqueous lithium-ion chemistries, Science, 2015, 350(6263), 938.
Suo et al. "Water-in-Salt" Electrolyte Makes Aqueous Sodium-Ion Battery Safe, Green, and Long-Lasting, Advanced Energy Materials, 2017, 7(21).
Taggougui et al. Solvents in salt electrolyte: Benefits and possible use as electrolyte for lithium-ion battery, Electrochimica Acta, 2008, 53(17), 5496.
Wang et al. Highly reversible zinc metal anode for aqueous batteries, Nature materials, 17 (2018) 543-549.

\* cited by examiner

METHODS FOR ELECTRODEPOSITION

CROSS-REFERENCE TO RELATED APPLICATIONS

This application claims the benefit of priority to U.S. Provisional Application No. 62/783,371 filed Dec. 21, 2018, which is hereby incorporated herein by reference in its entirety.

BACKGROUND

Electrodeposition is a method of depositing materials by applying electric power through an electrolyte comprising ionic species, wherein the ionic species are electrochemically oxidized or reduced and are deposited as materials on electrodes. Aqueous electrolytes prepared by dissolving salt species into water are most commonly used for electrodeposition. The use of water in the aqueous electrolyte for electrodeposition inevitably leads to the presence of protons and the reduction reaction between protons and water. Such reactions consume electric power, lower the power efficiency of electrodeposition, and can even disable the deposition of some materials. Such reactions also result in high incorporation of hydrogen and other impurities, increases stress, and changes other properties of the deposited materials.

Methods of electrodeposition where water molecules and proton concentrations are minimized are needed. Non-aqueous electrolytes, such as organic solvents, molten salts, and ionic liquids, have been used. But such methods typically suffer from low solubility of salts of the materials to be deposited, high volatility, high toxicity, high cost, difficult handling procedures, or low compatibility with high volume manufacturing processes.

Therefore, methods of electrodeposition using aqueous electrolytes where the hydrogen reduction and other detrimental effects are minimized are needed. More specifically, methods of electrodeposition using aqueous electrolytes where the water molecules and proton concentration are minimized are needed. The methods discussed herein address these and other needs.

SUMMARY

In accordance with the purposes of the disclosed systems and methods, as embodied and broadly described herein, the disclosed subject matter relates to systems and methods for electrodeposition. More specifically, the disclosed subject matter relates to a method of electrodepositing materials using an aqueous electrolyte, the aqueous electrolyte comprising a high concentration of a solvate, wherein hydration of the solvate can confine and deplete free water molecules in the aqueous electrolyte.

Disclosed herein are methods of electrodeposition, the methods comprising: applying an electric potential to a working electrode, wherein the working electrode is in electrochemical contact with an aqueous electrolyte and the aqueous electrolyte is further in electrochemical contact with a counter electrode; wherein the aqueous electrolyte comprises a solvate and a salt; wherein the solvate comprises an alkali metal salt, an alkaline earth metal salt, a transition metal salt, an organic compound, or a combination thereof; wherein the solvate has a concentration in the aqueous electrolyte of 1 mole per liter (M) or more; wherein the salt comprises a metal, a metalloid, a nonmetal, or a combination thereof; wherein the solvate and the salt are the same or different; and wherein the solvate has a lower reduction potential than the salt when the solvate and the salt are different; thereby reducing at least a portion of the salt in the aqueous electrolyte and electrodepositing a layer comprising the metal, the metalloid, the nonmetal, or combination thereof.

In some examples, the aqueous electrolyte has a decreased number of free water molecules than the corresponding aqueous electrolyte where the concentration of the solvate is less than 1 M. In some examples, the method has a suppressed $H^+$ reduction compared to the corresponding method performed using the corresponding aqueous electrolyte where the concentration of the solvate is less than 1 M.

In some examples, the solvate comprises an alkali metal salt comprising an alkali metal selected from the group consisting of lithium, sodium, potassium, rubidium, cesium, and combinations thereof. In some examples, the solvate comprises an alkaline earth metal salt comprising an alkaline earth metal selected from the group consisting of magnesium, calcium, strontium, barium, and combinations thereof. In some examples, the solvate comprises a transition metal salt comprising a transition metal selected from the group consisting of Ti, V, Cr, Mn, Fe, Co, Ni, Cu, Zn, Zr, Nb, Mo, Tc, Ru, Rh, Pd, Ag, Cd, Ta, W, Re, Os, Ir, Pt, Au, Hg, and combinations thereof. In some examples, the solvate comprises an organic compound comprising an element selected from the group consisting of sulfur, oxygen, nitrogen, phosphorous, other non-metallic elements, and combinations thereof. In some examples, the solvate comprises an organic compound selected from the group consisting of choline, ammonia, an ammonium salt, imine, imide, fructose, glucose, sucrose, and combinations thereof. In some examples, the solvate comprises ammonium acetate, ammonium chloride, ammonium formate, ammonium nitrate, ammonium thiocyanate, tetrabutylammonium chloride, tetrabutylammonium sulfate, cesium acetate, cesium chloride, cesium formate, calcium chloride, indium chloride, lithium acetate, lithium chloride (LiCl), lithium formate, lithium thiocyanate, lithium bis(trifluoromethane sulfonyl) imide (LiTFSI), potassium acetate, potassium chloride, potassium thiocyanate, rubidium chloride, rubidium formate, sodium chloride, sodium formate, zinc chloride, choline chloride, fructose, glucose, mannose, sucrose, xylose, urea, thiourea, polyethyleneimine, polyethylene glycol, dioxime, dimethyl glyoxime, mercapto-propylsulfonate, saccharin, or a combination thereof. In some examples, the concentration of the solvate is 2 M or more (e.g., 5 M or more, or 10 M or more).

In some examples, the metal, the metalloid, the nonmetal, or combination thereof comprising the salt is/are selected from the group consisting of Al, Si, Ti, V, Cr, Mn, Fe, Co, Ni, Cu, Zn, Ga, Ge, As, Se, Zr, Nb, Mo, Tc, Ru, Rh, Pd, Ag, Cd, In, Sn, Sb, Te, Ta, W, Re, Os, Ir, Pt, Au, Hg, Tl, Pb, Bi, and combinations thereof. In some examples, the metal, the metalloid, the nonmetal, or combination thereof comprising the salt is/are selected from the group consisting Re, W, Ru, Pd, Zn, Fe, Co, Mn, Se, Ni, Ga, As, Cu, In, Sn, Si, Ge, and combinations thereof. In some examples, the salt has a concentration in the aqueous electrolyte of from 0.001 M to 1 M when the salt and the solvate are different.

In some examples the electrodeposited layer comprises Re, Mn, Nb, Si, Ge, Ga, Mo, Ru, ReW, ReRu, ReMn, ReFe, ReCo, ReNi, ReMo, PdZn, RuFe, RuCo, RuNi, RuMo, FeMn, CoMn, NiFeMo, FeCoMn, FeCoSe, NiFeSe, GaAs, CuInGa, CuInGaSe, or combinations thereof.

In some examples, the method has an improved power consumption compared to the corresponding method performed using the corresponding aqueous electrolyte where the concentration of the solvate is less than 1 M. In some examples, the electrodeposited layer has a lower amount of hydrogen incorporated therein compared to the corresponding electrodeposited layer resulting from the corresponding method performed using the corresponding aqueous electrolyte where the concentration of the solvate is less than 1 M. In some examples, the electrodeposited layer has an improved morphology and/or an improved property compared to the corresponding electrodeposited layer resulting from the corresponding method performed using the corresponding aqueous electrolyte where the concentration of the solvate is less than 1 M.

In some examples, the aqueous electrolyte comprises water and an additional solvent. In some examples, the additional solvent comprises ethanol, isopropanol, ethylene glycol, polyethylene glycol, glycerol, alkane diol, and combinations thereof.

In some examples, the method comprises applying an electric current with a current density and the applied electric current density is from −400 milliampere per square centimeter (mA/cm$^2$) to −5 mA/cm$^2$ (e.g., from −100 mA/cm$^2$ to −10 mA/cm$^2$, or from −50 to −20 mA/cm$^2$). In some examples, the applied electric potential is from −3 volts (V) to −0.2 V (e.g., from −2 V to −0.5 V, or from −1.5 to −0.8 V).

In some examples, the methods further comprise annealing the electrodeposited layer at a temperature of from 100° C. to 2000° C.

Also disclosed herein are samples comprising the electrodeposited layer made using any of the methods described herein. Also disclosed herein are methods of use of the samples described herein, the methods of use comprising using the sample as a coating, in an electronic device, in a microdevice, in an aerospace device, or a combination thereof.

Additional advantages of the disclosed systems and methods will be set forth in part in the description which follows, and in part will be obvious from the description. The advantages of the disclosed systems and methods will be realized and attained by means of the elements and combinations particularly pointed out in the appended claims. It is to be understood that both the foregoing general description and the following detailed description are exemplary and explanatory only and are not restrictive of the disclosed systems and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE FIGURES

The accompanying figures, which are incorporated in and constitute a part of this specification, illustrate several aspects of the disclosure, and together with the description, serve to explain the principles of the disclosure.

DETAILED DESCRIPTION

Figure 1:
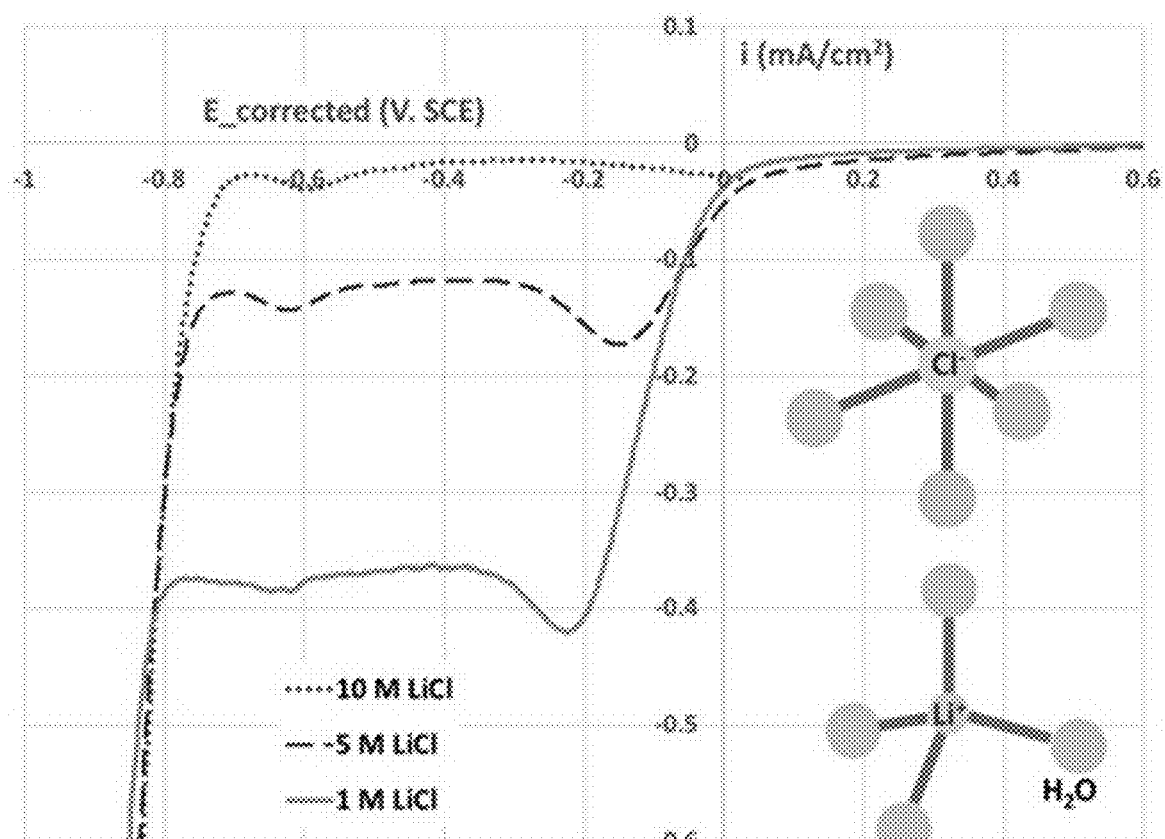
FIG. 1 shows the effect of LiCl concentration on the proton reduction current density in plain electrolytes with (red dotted line) 10, (blue dashed line) 5, and (green solid line) 1 M LiCl. Insets are the configurations of hydrated chloride anion and lithium cation in dilute electrolyte.

The methods described herein may be understood more readily by reference to the following detailed description of specific aspects of the disclosed subject matter and the Examples included therein.

Before the present methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

"Optional" or "optionally" means that the subsequently described event or circumstance can or cannot occur, and that the description includes instances where the event or circumstance occurs and instances where it does not.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

Disclosed herein are methods of electrodeposition, the methods comprising applying an electric potential to a working electrode; wherein the working electrode is in electrochemical contact with an aqueous electrolyte and the aqueous electrolyte is further in electrochemical contact with a counter electrode; wherein the aqueous electrolyte comprises a solvate and a salt, wherein the salt comprises a metal, a metalloid, a nonmetal, or a combination thereof; and wherein the in method thereby reduces at least a portion of the salt in the aqueous electrolyte and electrodeposits a layer comprising the metal, the metalloid, the nonmetal, or combination thereof. In some examples, a reference electrode can further be in electrochemical contact with the aqueous electrolyte.

The working electrode, the counter electrode, and/or the reference electrode can comprise any conducting and/or semiconducting material consistent with the methods described herein. Appropriate materials for working electrodes and counter electrodes are well known in the art.

For example, the working electrode, the counter electrode, the reference electrode, or combination thereof can comprise(s) a transparent conducting oxide, a polymer, a carbon material, a metal, an alloy, a compound, a semiconductor, or a combination thereof. The metal can, for example, be selected from the group consisting of Be, Mg, Al, Ca, Sc, Ti, V, Cr, Mn, Fe, Co, Ni, Cu, Zn, Ga, Sr, Y, Zr, Nb, Mo, Tc, Ru, Rh, Pd, Ag, Cd, In, Sn, Ba, Hf, Ta, W, Re, Os, Ir, Pt, Au, Hg, Tl, Pb, Bi, La, Ce, Pr, Nd, Pm, Sm, Eu, Gd, Tb, Dy, Ho, Er, Tm, Yb, and combinations thereof. The semiconductor can, for example, be selected from the group consisting of Si, Ge, GaAs, InGaAs, InSb, GaSb, InP, GaN, InGaP, ZnO, ZnSe, CdTe, ZnTe, SbTe, CuZnSe, CuInSe, TaN, TiN, RuO, and combinations thereof. Examples of carbon materials include, but are not limited to, graphitic carbon and graphites, including pyrolytic graphite (e.g., highly ordered pyrolytic graphite (HOPG)) and isotropic graphite, amorphous carbon, carbon black, single- or multi-walled carbon nanotubes, graphene, glassy carbon, diamond-like carbon (DLC) or doped DLC, such as boron-doped diamond, pyrolyzed photoresist films, and others known in the art.

The aqueous electrolyte comprises the solvate and the salt, wherein the solvate and the salt can be the same or different. The solvate comprises an alkali metal salt, an alkaline earth metal salt, a transition metal salt, an organic compound (e.g., an ammonium salt), or a combination thereof. The solvate has a lower reduction potential than the salt, when the solvate and the salt are different. In some examples, the solvate can comprise an alkali metal salt comprising an alkali metal selected from the group consisting of lithium, sodium, potassium, rubidium, cesium, and combinations thereof. In some examples, the solvate can comprise an alkaline earth metal salt comprising an alkaline earth metal selected from the group consisting of magnesium, calcium, strontium, barium, and combinations thereof. In some examples, the solvate can comprise a transition metal salt comprising a transition metal selected from the group consisting of Ti, V, Cr, Mn, Fe, Co, Ni, Cu, Zn, Zr, Nb, Mo, Tc, Ru, Rh, Pd, Ag, Cd, Ta, W, Re, Os, Ir, Pt, Au, Hg, and combinations thereof. In some examples, the solvate can comprise an organic compound comprising an element selected from the group consisting of sulfur, oxygen, nitrogen, phosphorous, other non-metallic elements, and combinations thereof. In some examples, the solvate can comprise an organic compound selected from the group consisting of choline, ammonia, an ammonium salt, an imine, an imide, fructose, glucose, sucrose, and combinations thereof. The solvate can, for example, comprise ammonium acetate, ammonium chloride, ammonium formate, ammonium nitrate, ammonium thiocyanate, tetrabutylammonium chloride, tetrabutylammonium sulfate, cesium acetate, cesium chloride, cesium formate, calcium chloride, indium chloride, lithium acetate, lithium chloride (LiCl), lithium formate, lithium thiocyanate, lithium bis(trifluoromethane sulfonyl) imide (LiTFSI), potassium acetate, potassium chloride, potassium thiocyanate, rubidium chloride, rubidium formate, sodium chloride, sodium formate, zinc chloride, choline chloride, fructose, glucose, mannose, sucrose, xylose, urea, thiourea, polyethyleneimine, polyethylene glycol, dioxime, dimethyl glyoxime, mercapto-propylsulfonate, saccharin, or a combination thereof.

The solvate has a concentration in the aqueous electrolyte of 1 mole per liter (M) or more (e.g., 2 M or more, 3 M or more, 4 M or more, 5 M or more, 6 M or more, 7 M or more, 8 M or more, 9 M or more, or 10 M or more). The aqueous electrolyte can have a decreased number of free water molecules than the corresponding aqueous electrolyte where the concentration of the solvate is less than 1 M.

The salt comprises a metal, metalloid, nonmetal, or combination thereof, wherein the metal, the metalloid, the nonmetal, or combination thereof is/are selected from the group consisting of Al, Si, Ti, V, Cr, Mn, Fe, Co, Ni, Cu, Zn, Ga, Ge, As, Se, Zr, Nb, Mo, Tc, Ru, Rh, Pd, Ag, Cd, In, Sn, Sb, Te, Ta, W, Re, Os, Ir, Pt, Au, Hg, Tl, Pb, Bi, and combinations thereof. In some examples, the metal, the metalloid, the nonmetal, or combination thereof comprising the salt is/are selected from the group consisting Re, W, Ru, Pd, Zn, Fe, Co, Mn, Se, Ni, Ga, As, Cu, In, Sn, Si, Ge, and combinations thereof.

The salt can be the same or different than the solvate. The salt can, for example, have a concentration in the aqueous electrolyte of 0.001 M or more when the salt is different than the solvate (e.g., 0.005 M or more, 0.01 M or more, 0.05 M or more, 0.1 M or more, or 0.5 M or more). In some examples, the salt can have a concentration in the aqueous electrolyte of 1 M or less when the salt is different than the solvate (e.g., 0.5 M or less, 0.1 M or less, 0.05 M or less, 0.01 M or less, or 0.005 M or less). The concentration of the salt in the aqueous electrolyte when the salt is different than the solvate can range from any of the minimum values described above to any of the maximum values described above. For example, the salt can have a concentration in the aqueous electrolyte of from 0.001 M to 1 M when the salt is different than the solvate (e.g., from 0.001 M to 0.5 M, from 0.001 M to 0.1 M, from 0.001 M to 0.01 M, or from 0.005 M to 0.5 M).

The aqueous electrolyte comprises water as a solvent. In some examples, the aqueous electrolyte can further comprise an additional solvent. The additional solvent can comprise any suitable solvent. For example, the additional solvent can comprise ethanol, isopropanol, ethylene glycol, polyethylene glycol, glycerol, alkane diol, and combinations thereof.

The electrodeposited layer can, for example, comprise Re, Mn, Nb, Si, Ge, Ga, Mo, Ru, ReW, ReRu, ReMn, ReFe, ReCo, ReNi, ReMo, PdZn, RuFe, RuCo, RuNi, RuMo, FeMn, CoMn, NiFeMo, FeCoMn, FeCoSe, NiFeSe, GaAs, CuInGa, CuInGaSe, or combinations thereof. In some examples, the electrodeposited layer has a lower amount of hydrogen incorporated therein compared to the corresponding electrodeposited layer resulting from the corresponding method performed using the corresponding aqueous electrolyte where the concentration of the solvate is less than 1 M. The electrodeposited layer can, for example, have an improved morphology and/or an improved property compared to the corresponding electrodeposited layer resulting from the corresponding method performed using the corresponding aqueous electrolyte where the concentration of the solvate is less than 1 M.

In some examples, the working electrode and the counter electrode can be electrically connected to a voltage source. The voltage source can be configured to apply an electric potential to the working electrode, the counter electrode, or a combination thereof so as to establish a voltage between the working electrode and the counter electrode. Suitable voltage sources are known in the art.

The method can comprise applying an electric current with a current density and the applied electric current density can, for example, be −400 milliampere per square centimeter (mA/cm$^2$) or more (e.g., −350 mA/cm$^2$ or more, −300 mA/cm$^2$ or more, −250 mA/cm$^2$ or more, −200 mA/cm$^2$ or more, −150 mA/cm$^2$ or more, −100 mA/cm$^2$ or more, −50 mA/cm$^2$ or more, −40 mA/cm$^2$ or more, −30 mA/cm$^2$ or more, or −20 mA/cm$^2$ or more). In some examples, the applied electric current density can be −5 mA/cm$^2$ or less (e.g., −10 mA/cm$^2$ or less, −20 mA/cm$^2$ or less, −30 mA/cm$^2$ or less, −40 mA/cm$^2$ or less, −50 mA/cm$^2$ or less, −100 mA/cm$^2$ or less, −150 mA/cm$^2$ or less, −200 mA/cm$^2$ or less, −250 mA/cm$^2$ or less, or −300 mA/cm$^2$ or less).

The applied electric current density can range from any of the minimum values described above to any of the maximum values described above. For example, the applied electric current density can range from −400 mA/cm$^2$ to −5 mA/cm$^2$ (e.g., from −300 mA/cm$^2$ to −5 mA/cm$^2$, from −200 mA/cm$^2$ to −5 mA/cm$^2$, from −100 mA/cm$^2$ to −10 mA/cm$^2$, or from −50 mA/cm$^2$ to −20 mA/cm$^2$).

The applied electric potential can, for example, be −3 volts (V) or more (e.g., −2.5 V or more, −2 V or more, −1.5 V or more, −1 V or more, −0.9 V or more, −0.8 V or more, −0.7 V or more, −0.6 V or more, −0.5 V or more, or −0.4 V or more). In some examples, the applied electric potential can be −0.2 V or less (e.g., −0.3 V or less, −0.4 V or less, −0.5 V or less, −0.6 V or less, −0.7 V or less, −0.8 V or less, −0.9 V or less, −1 V or less, −1.5 V or less, or −2 V or less). The applied electric potential can range from any of the minimum values described above to any of the maximum values described above. For example, the applied electric potential can be from −3 volts (V) to −0.2 V (e.g., from −3 or more, to −0.5 V, from −2 V to −0.5 V, or from −1.5 to −0.8 V).

In some examples, the applied electric potential is measured against a reference electrode, such as a standard hydrogen electrode (SHE), saturated calomel electrode (SCE), silver-silver chloride electrode, a platinum strip, or a copper strip. Any suitable reference electrode compatible with the systems and methods described herein can be used. Suitable reference electrodes are known in the art.

In some examples, the method can have an improved power consumption compared to the corresponding method performed using the corresponding aqueous electrolyte where the concentration of the solvate is less than 1 M. In some examples, the method can have a suppressed H$^+$ reduction compared to the corresponding method performed using the corresponding aqueous electrolyte where the concentration of the solvate is less than 1 M.

In some examples, the methods can further comprise annealing the electrodeposited layer. For example, the electrodeposited layer can be annealed at a temperature of 100° C. or more (e.g., 150° C. or more, 200° C. or more, 250° C. or more, 300° C. or more, 350° C. or more, 400° C. or more, 450° C. or more, 500° C. or more, 600° C. or more, 700° C. or more, 800° C. or more, 900° C. or more, 1000° C. or more, 1100° C. or more, 1200° C. or more, 1300° C. or more, 1400° C. or more, 1500° C. or more, 1600° C. or more, 1700° C. or more, or 1800° C. or more). In some examples, the electrodeposited layer can be annealed at a temperature of 2000° C. or less (e.g., 1900° C. or less, 1800° C. or less, 1700° C. or less, 1600° C. or less, 1500° C. or less, 1400° C. or less, 1300° C. or less, 1200° C. or less, 1100° C. or less, 1000° C. or less, 900° C. or less, 800° C. or less, 700° C. or less, 600° C. or less, 500° C. or less, 450° C. or less, 400° C. or less, 350° C. or less, 300° C. or less, 250° C. or less, or 200° C. or less). The temperature at which the electrodeposited layer is annealed can range from any of the minimum values described above to any of the maximum values described above. For example, the electrodeposited layer can be annealed at a temperature of from 100° C. to 2000° C. (e.g., from 100° C. to 1000° C., from 1000° C. to 2000° C., from 100° C. to 500° C., from 500° C. to 1000°

C., from 1000° C. to 1500° C., from 1500° C. to 2000° C., from 250° C. to 2000° C., from 100° C. to 1800° C., or from 250° C. to 1800° C.).

Also described herein are samples comprising electrodeposited layers made using any of the methods described herein. Also described herein are methods of use of the samples described herein. For examples, the samples comprising the electrodeposited layers can be used as a coating, in an electronic device, in a microdevice, in an aerospace device, or a combination thereof.

A number of embodiments of the invention have been described. Nevertheless, it will be understood that various modifications may be made without departing from the spirit and scope of the invention. Accordingly, other embodiments are within the scope of the following claims.

The examples below are intended to further illustrate certain aspects of the methods and compounds described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods, compositions, and results. These examples are not intended to exclude equivalents and variations of the present invention, which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures, and other reaction ranges and conditions that can be used to optimize the product purity and yield obtained from the described process. Only reasonable and routine experimentation will be required to optimize such process conditions.

Example 1

LiCl Electrolyte

An example lithium chloride (LiCl) electrolyte is described in this example, where the electrolyte comprises LiCl in a concentration of from 0 M to 10 M. FIG. 1 shows the effects of high concentration of LiCl on the proton reduction reaction rate in this electrolyte on Pt rotating disk electrodes (RDE) at 400 revolutions per minute (rpm). As the LiCl concentration increased from 1 M to 5 M to 10 M, the maximum proton reduction current decreased from $-0.37$ mA/cm$^2$ to $-0.12$ mA/cm$^2$ to $-0.014$ mA/cm$^2$, by 3 and 26 times, respectively.

In fully hydrated electrolytes with excessive water, the inner hydration layer comprises four water molecules in a tetrahedron configuration for a lithium cation and six water molecules in an octahedron configuration for a chloride anion. Every mole of LiCl would consume 10 moles water molecules to form the inner hydration layer, or to become fully hydrated. The 5 M and 10 M LiCl electrolytes have a water concentration of about 48 M and 36 M, or a H$_2$O/LiCl ratio of 9.6 and 3.6, respectively. Therefore, the ions and water molecules in these electrolytes are expected to behave significantly differently from dilute electrolytes.

Example 2

LiCl Electrolyte

Figure 2:
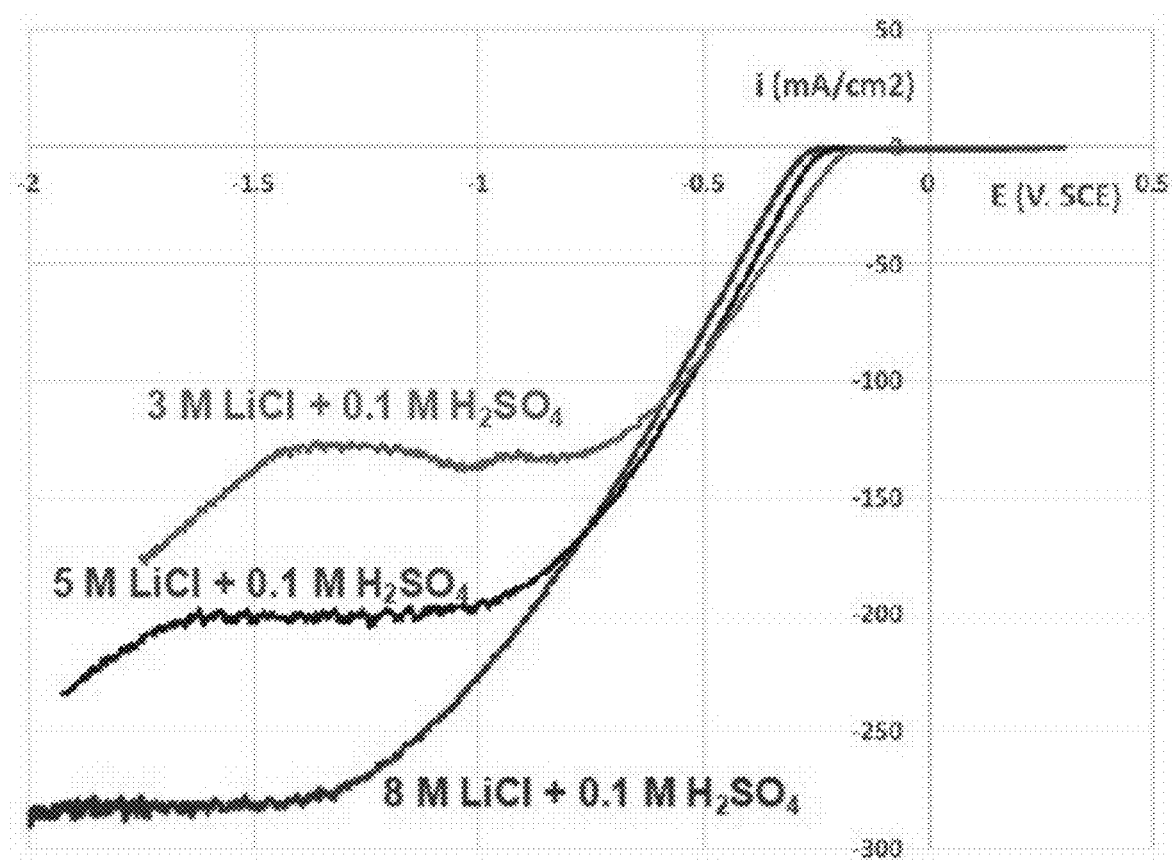
FIG. 2 shows the effect of LiCl concentration on the proton reduction in a Re free acidic electrolyte with (red) 3 M, (blue) 5 M, and (green) 8 M LiCl.

An example metal-free electrolyte comprising 0.1 M sulfuric acid (H$_2$SO$_4$) and various concentrations of LiCl (from 0 M to 10 M) is described herein. FIG. 2 shows the effect of high concentration of LiCl on the proton reduction reaction rate in this electrolyte on Pt RDE at 1600 rpm. As the LiCl concentration increased from 3 M to 5 M to 8 M, the maximum proton reduction current decreased from $-280$ mA/cm$^2$ to $-200$ mA/cm$^2$ to $-130$ mA/cm$^2$, e.g., by 1.4 and 2.2 times, respectively. The electrolyte with no LiCl ([LiCl] =0 M) did not show a maximum proton reduction current.

Example 3

Re Electrolyte

An example electrolyte comprising 0.025 M ammonia perrhenate (NH$_4$ReO$_4$), 0.1 M H$_2$SO$_4$, and LiCl of varying concentration from 0 M to 10 M is described herein. While LiCl has a solubility of 11.5 M at room temperature, a Re electrolyte with 7 M LiCl was opaque. Cyclic voltammetry (CV) was performed on a Pt rotating disk electrode at 1600 rpm for rhenium electrolytes with 0 M and 5 M LiCl, both of which were colorless and transparent.

Figure 3:
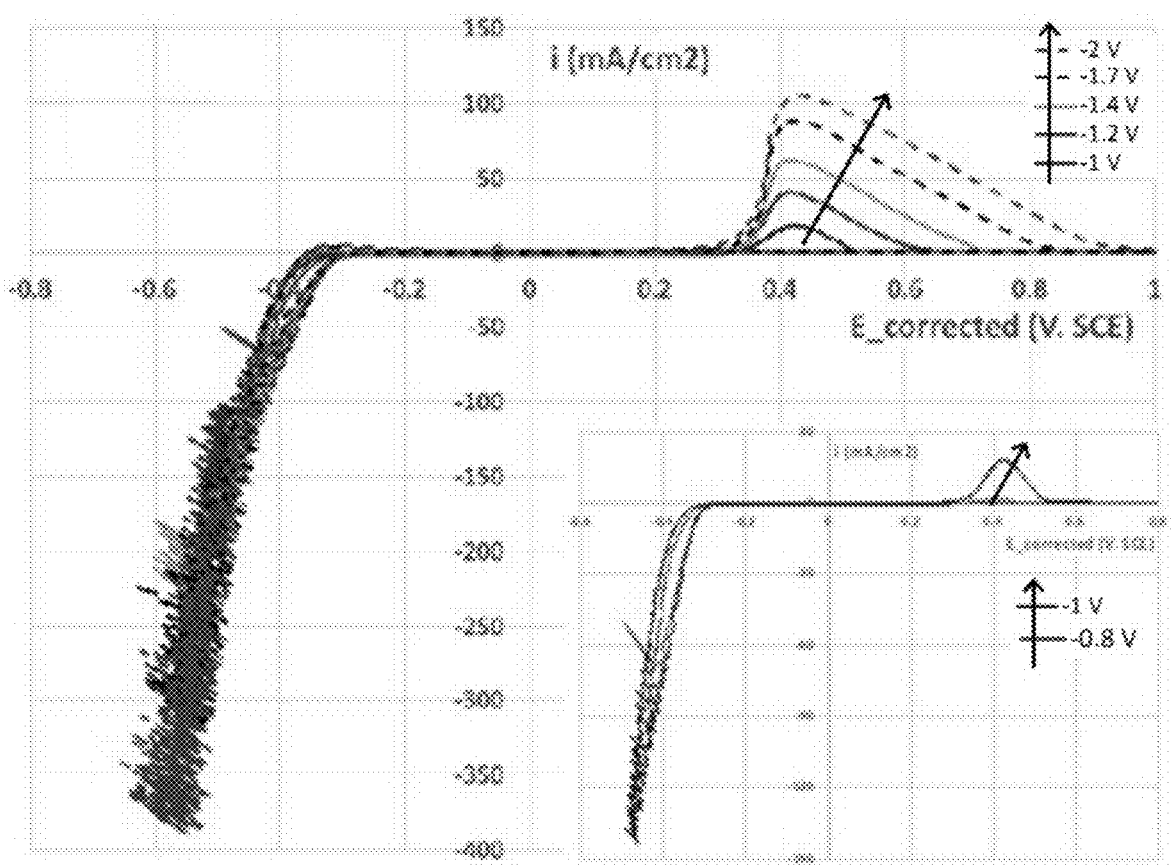
FIG. 3 is cyclic voltammograms on Pt rotating disk electrode at 1600 rpm with different cathodic potential boundaries for LiCl free traditional acidic Re electrolyte with potential corrected for ohmic drop in solution, and (inset) cyclic voltammograms down to −0.8 V and −1 V to show the start of Re deposition.

FIG. 3 shows the cyclic voltammogram of a Re electrolyte with 0 M LiCl on Pt RDE at 1600 rpm after ohmic correction for the voltage. It can be seen from FIG. 3 that the potential did not reach much below $-0.6$ V even when a potential of $-2$ V was applied. Due to this narrow range of potential, Re films were prepared using galvanostatic deposition at current densities from $-100$ mA/cm$^2$ to $-250$ mA/cm$^2$. The current efficiencies calculated from the film thickness and deposition time were all below 2%. No significant change was observed in the Re deposition rates between the films. The hydrogen evolution reaction contributed to the majority of current and no limiting current was observed at the conditions studied.

Figure 4:
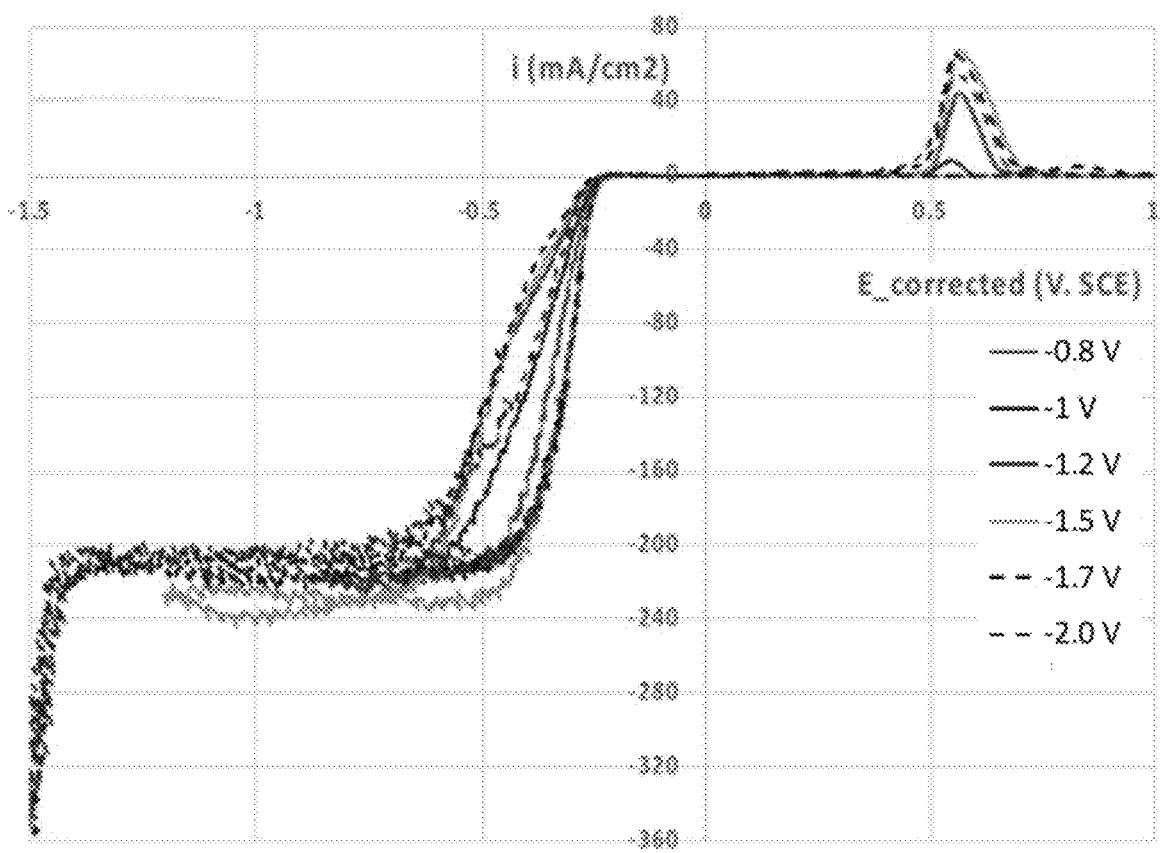
FIG. 4 is cyclic voltammograms on Pt rotating disk electrode at 1600 rpm with different cathodic potential boundaries for Re electrolyte with 5 M LiCl with potential corrected for ohmic drop in solution.

FIG. 4 shows the cyclic voltammogram of the Re electrolyte with 5 M LiCl on Pt RDE at 1600 rpm after ohmic correction for the voltage; a current plateau of about $-200$ mA/cm$^2$ was observed. The actual applied potential after ohmic drop correction reached beyond the case without LiCl. A sharp increase of current density was observed at about $-1.7$ V, or $-1.4$ V after ohmic correction, due to the reduction of water. Re films can be deposited from this electrolyte at a potential between $-0.6$ V and $-2$ V, or at a current density between $-150$ mA/cm$^2$ and $-300$ mA/cm$^2$.

Figure 5:
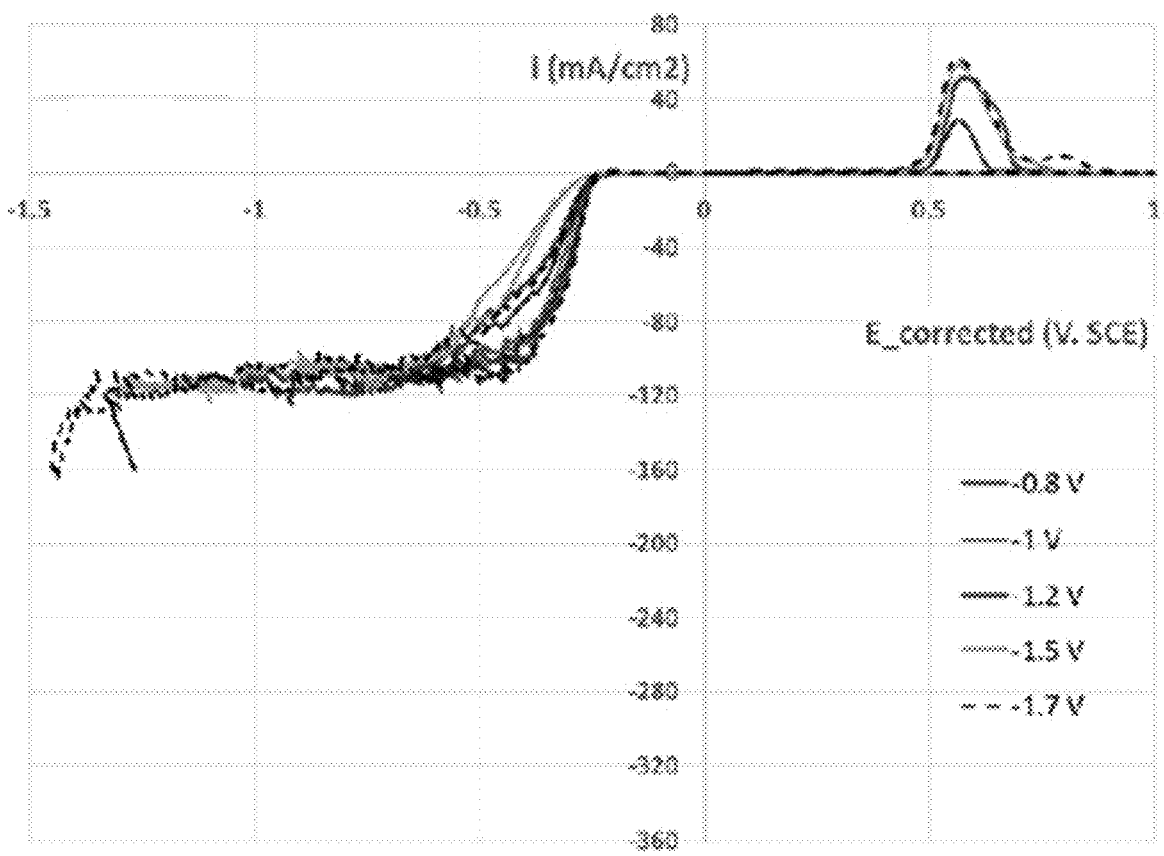
FIG. 5 is cyclic voltammograms on Pt rotating disk electrode at 400 rpm with different cathodic potential boundaries for Re electrolyte with 5 M LiCl with ohmic drop corrected.

FIG. 5 shows the cyclic voltammogram of the Re electrolyte with 5 M LiCl on Pt RDE at 400 rpm after ohmic correction for the voltage; a current plateau of about $-100$ mA/cm$^2$ was observed. Decreasing the rotation rate to 400 (¼ of 1600) rpm resulted in a halved current plateau, indicative of a mass transport limiting current. A sharp increase of current density was observed at about $-1.7$ V, or $-1.4$ V after ohmic correction, due to the reduction of water. Re films can be deposited from this electrolyte at a potential between $-0.6$ V and $-2$ V, or at a current density between $-80$ mA/cm$^2$ and $-300$ mA/cm$^2$.

Figure 6:
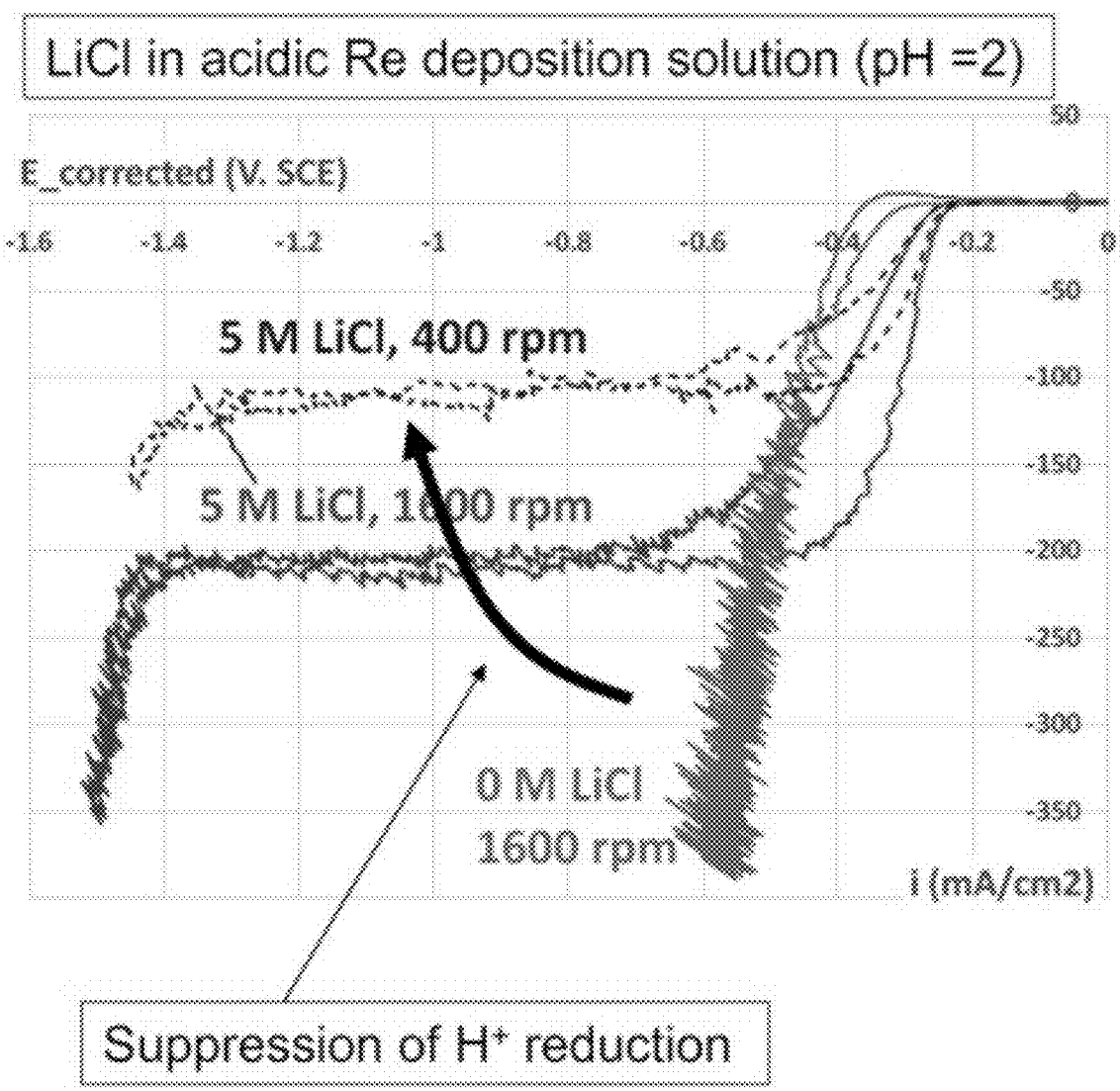
FIG. 6 shows the suppression of H$^+$ reduction during electrodeposition of Re from an acidic (pH=2) Re electrolyte when the electrolyte included 5 M LiCl.
Figures 7A, 7B, 7C, 7D:
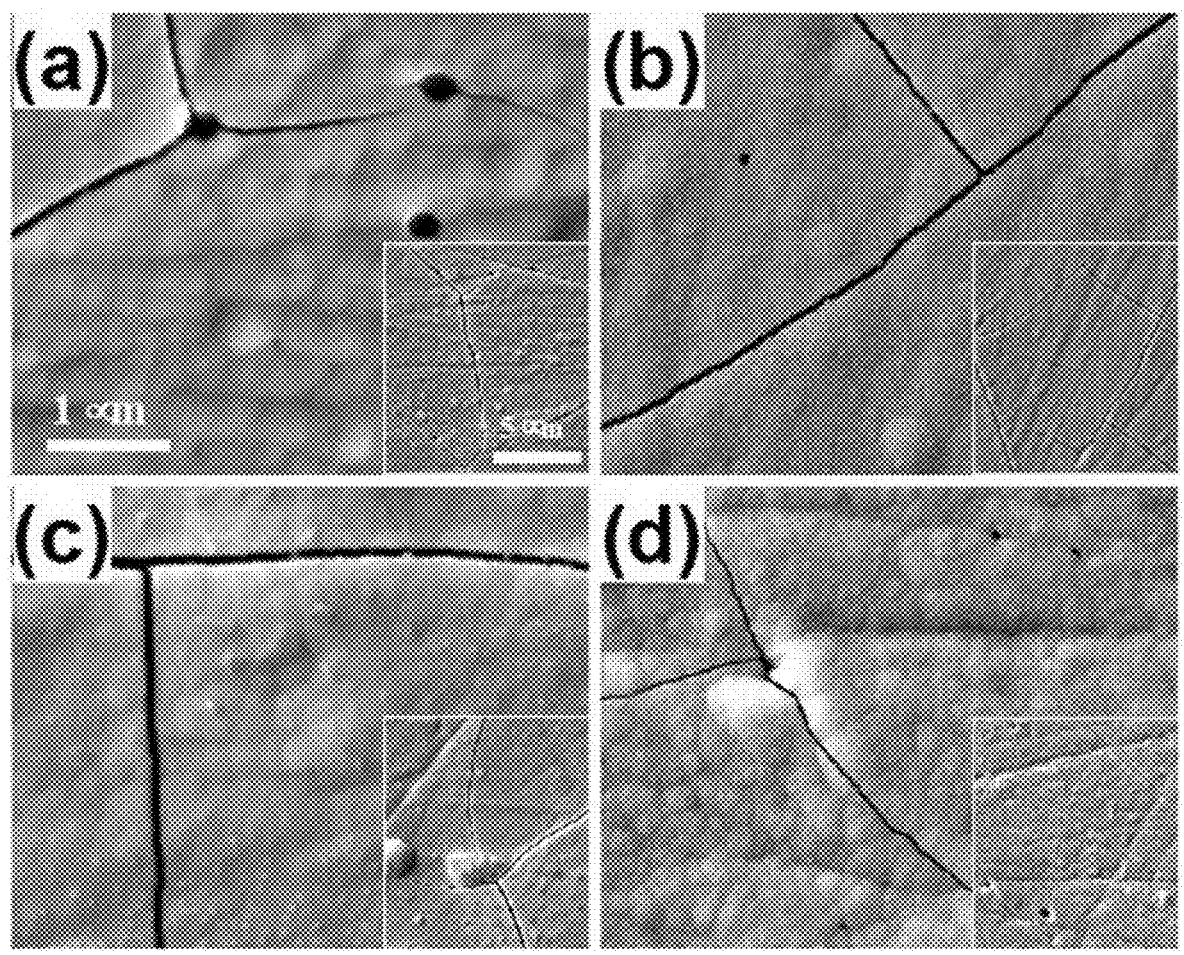
FIG. 7a-FIG. 7d are top down SEM micrographs of the surface morphology of rhenium films deposited from LiCl free traditional Re electrolyte at (FIG. 7a) −100 mA/cm$^2$, (FIG. 7b) −150 mA/cm$^2$, (FIG. 7c) −200 mA/cm$^2$, and (FIG. 7d) −250 mA/cm$^2$.
Figures 8A, 8B, 8C, 8D:
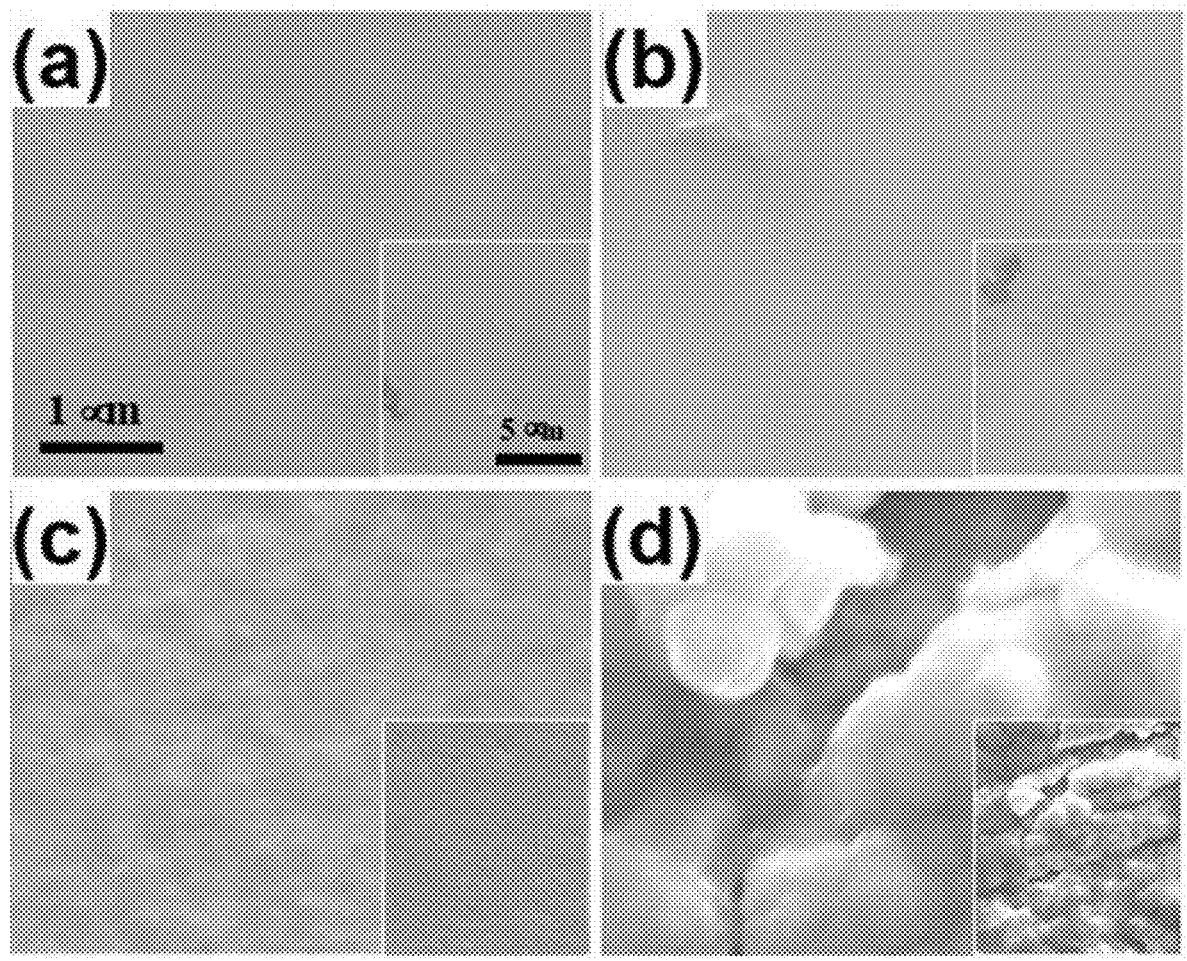
FIG. 8a-FIG. 8d are top down SEM micrographs of the surface morphology of rhenium films deposited from Re electrolyte with 5 M LiCl at (FIG. 8a) −1.0 V, (FIG. 8b) −1.1 V, (FIG. 8c) −1.2 V, and (FIG. 8d) −1.4 V.

FIG. 6 shows a comparison of the cyclic voltammograms of Re electrolytes with 0 M LiCl at 1600 rpm, 5 M LiCl at 1600 rpm, and 5 M LiCl at 400 rpm. Suppression of H$^+$ reduction during electrodeposition of Re from an acidic (pH=2) Re electrolyte was observed when the electrolyte included 5 M LiCl (FIG. 6).

Highly stressed films are often obtained along with a rapid hydrogen evolution and incorporation during electrodeposition. The morphology of rhenium films deposited on Cu rotating disk electrodes from the two different electrolytes were examined with SEM. FIG. 7a-FIG. 7d shows the morphology of films deposited from the traditional acidic LiCl-free electrolyte at a DC current density from −100 mA/cm² to −250 mA/cm². Cracks were observed on all films regardless of the current density used. In addition, pin holes were also observed, resulting from the hydrogen bubble blocking the electrode surface. Small nodules below 1 micron in size were also observed. On the other hand, FIG. 8a-FIG. 8d presents the SEM images of four films deposited from the water-in-salt Re electrolyte with 5 M LiCl at different DC potentials between −1 V and −1.4 V. Potential control was used in this case because a current plateau is present in the cyclic voltammetry. In other words, the deposition current was approximately the same under the limiting current condition regardless of the applied potential and, therefore, potential control is necessary. No film cracks were observed. A flaky film delaminated from the copper substrate was obtained at −1.4 V, which can relate to the further reduction of Re into a rhenide anion. A continuous smooth film with nanometric nodules was obtained at −1.2 V. Extremely smooth continuous films were obtained at −1 V and −1.1 V. As shown in the insets, crystal-like features of a few microns in size and sub-micron sized flower shaped features were observed sporadically.

Figure 9:
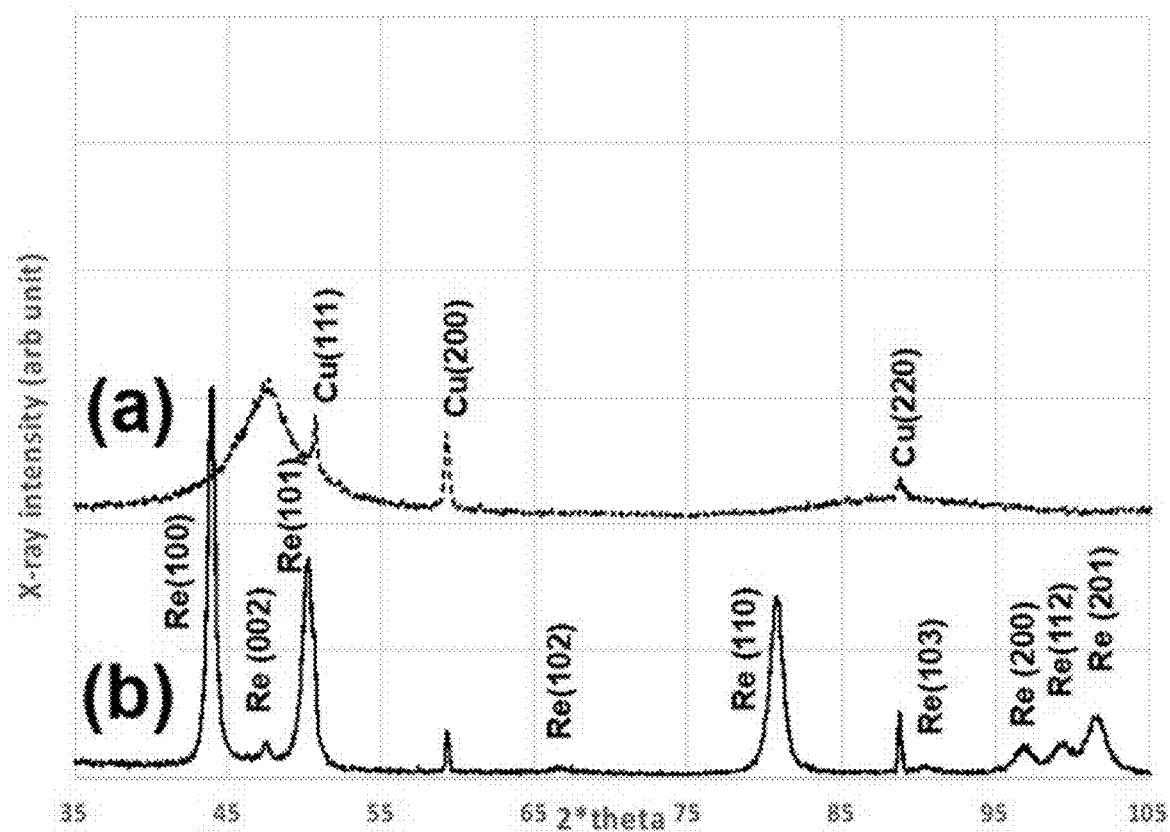
FIG. 9 is an X-ray diffraction spectrum, labeled "(a)", of a rhenium film deposited from Re electrolyte with 5 M LiCl at −1.0 V, and XRD spectrum, labeled "(b)", and (inset) top-down SEM image of the same rhenium film after vacuum annealing at 400° C. for 6 hours.

The crystallinity of the electrodeposited Re films were characterized with X-ray diffraction. FIG. 9 shows the spectrum (labeled "(a)") of the same film in FIG. 8a deposited at −1 V. Only two broad peaks at 2θ of 47.8° and 88.8° were observed in the spectrum, suggesting an amorphous or nanocrystalline film. Such amorphous or nanocrystalline characteristics were observed for all the as deposited films regardless of the electrolytes, potentials, or currents used for deposition. Polycrystalline Re films were obtained upon a high temperature annealing at 600° C. for 5 hours for all the electrodeposited films. As shown in FIG. 9, spectrum (b), all the XRD peaks can be assigned to metallic Re.

Si coupons with Au strip patterns were used to deposit Re for superconductivity measurements. Such substrates were fabricated on Si wafers with 50 nm thermal $SiO_2$, a layer of 10 nm Ti and 100 nm Au. The Si coupon was mounted on a holder rotating in the same way as rotating disk electrode at 400 rpm. Electrical connections were made through a front pin contact to the pad.

Figure 10:
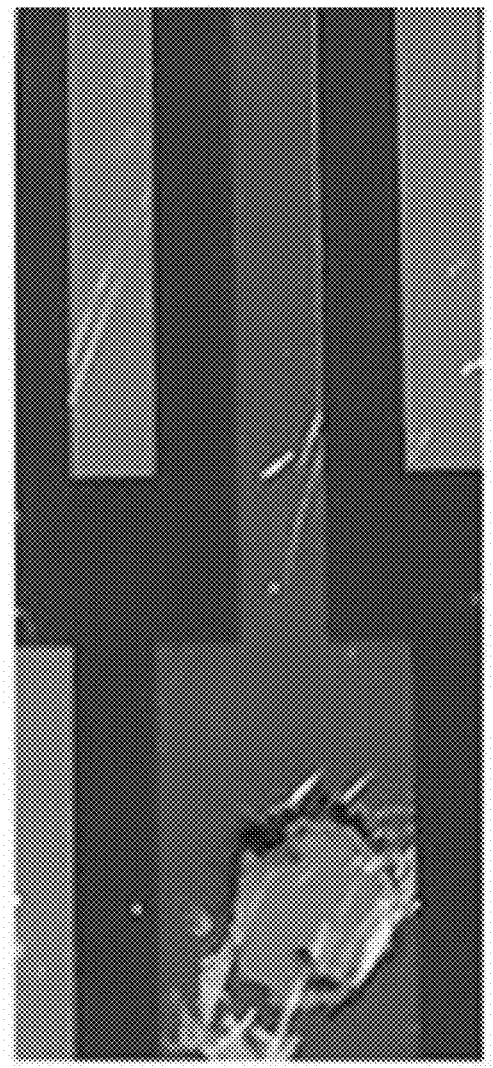
FIG. 10 is an optical image of a rhenium film deposited from Re electrolyte with 5 M LiCl at −1.0 V on patterned Au strip.
Figure 11:
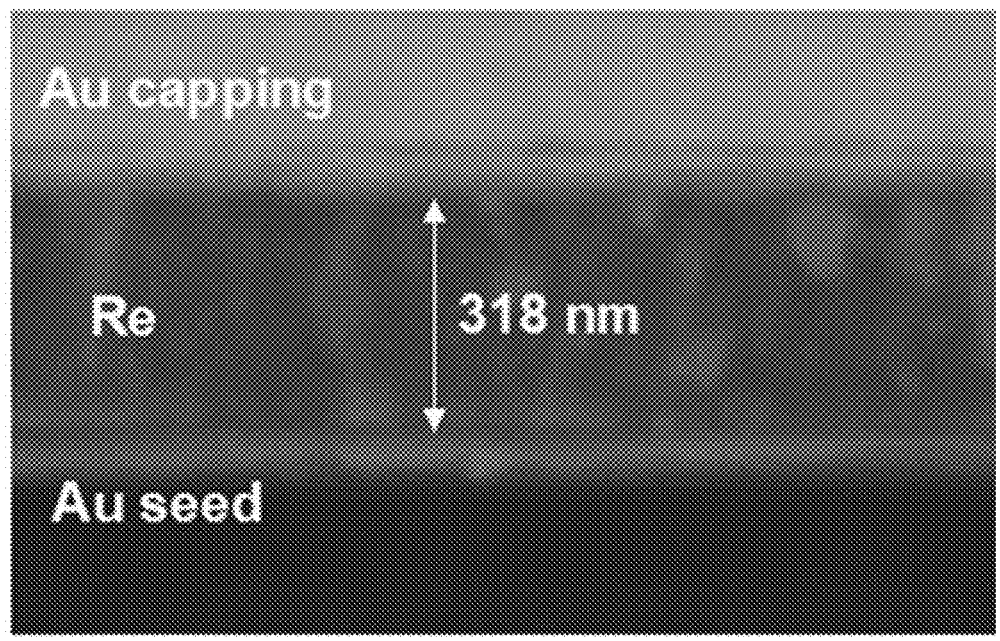
FIG. 11 is a cross sectional SEM image of a rhenium film deposited from Re electrolyte with 5 M LiCl at −1.0 V on patterned Au strip.
Figure 12:
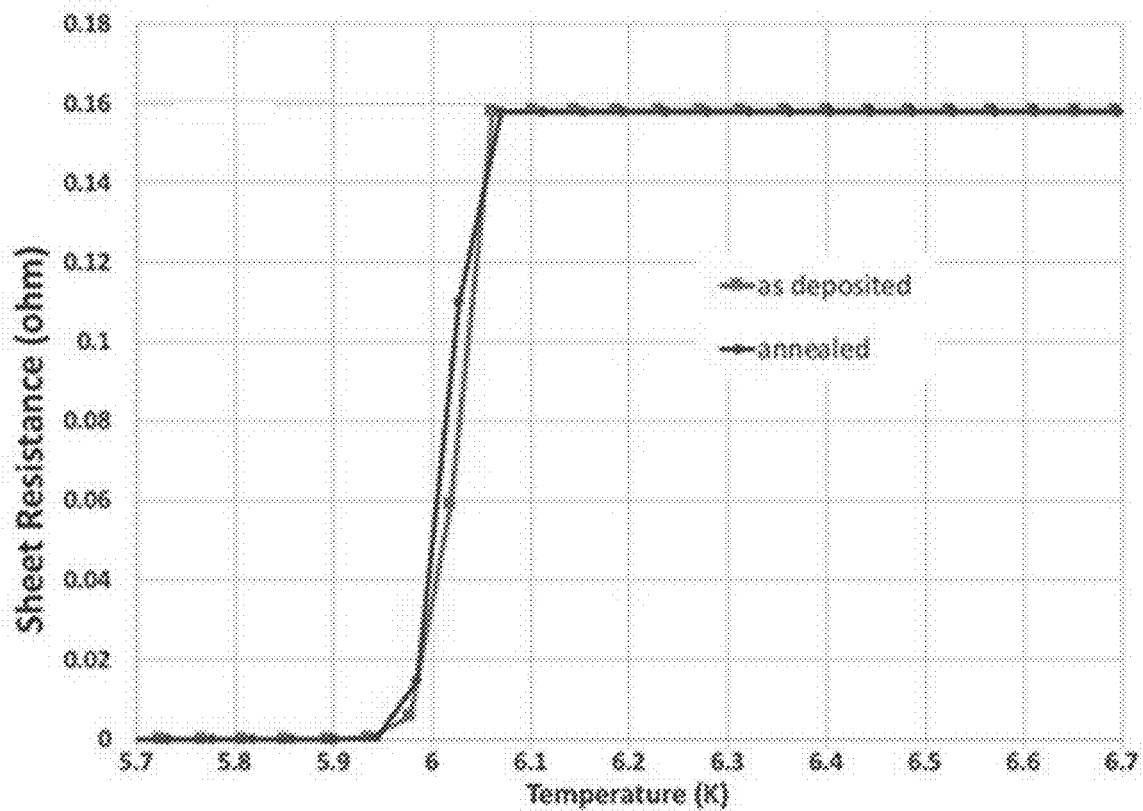
FIG. 12 shows the dependence of resistance on temperature of the Re strip before and after annealing at 400 K for 30 minutes.

Re films were electrodeposited on silicon substrates patterned with 1 mm wide Au strips. FIG. 10 and FIG. 11 show the optical image and cross section SEM, respectively, of a Re strip deposited from a Re electrolyte with 5 M LiCl at −1 V. The as deposited Re is a smooth, shiny, gray colored strip with a thickness of 318 nm. Four point-contacts were made along the strip with aluminum wire bonding and the resistivity was measured as the temperature decreased from 8 K to 4 K. As shown in FIG. 12, the resistance suddenly drops to 0 ohm at a $T_c$ between 5.95 K to 6.05 K. The same measurements were repeated after annealing at 400 K for 30 minutes and no change was observed in $T_c$. The same measurements were repeated after further annealing at 400 K for 1200 minutes and still no change was observed in $T_c$. While a small increase of $T_c$ was also reported for evaporated Re as the film thickness increased due to the buildup of film stress, this increase diminishes and $T_c$ falls back toward the intrinsic value of 1.7 K upon room temperature aging. Such a decrease of $T_c$ was also observed for Re films electrodeposited from traditional Re electrolytes with 0 M LiCl upon 400 K annealing. While the exact cause for the improvement in the $T_c$ stability is yet to be understood, different film stress and hydrogen incorporation resulted from the use of water-in-salt electrolyte can be involved. This can be related to the suppressed proton reduction and hydrogen incorporation, presence of a large amount of LiCl in the electrolyte and incorporation of chloride compound as an impurity, more negative potential achieved and incorporation of rhenide anion in the film, or a different film stress.

Example 4

Ni Electrolyte

Figure 13:
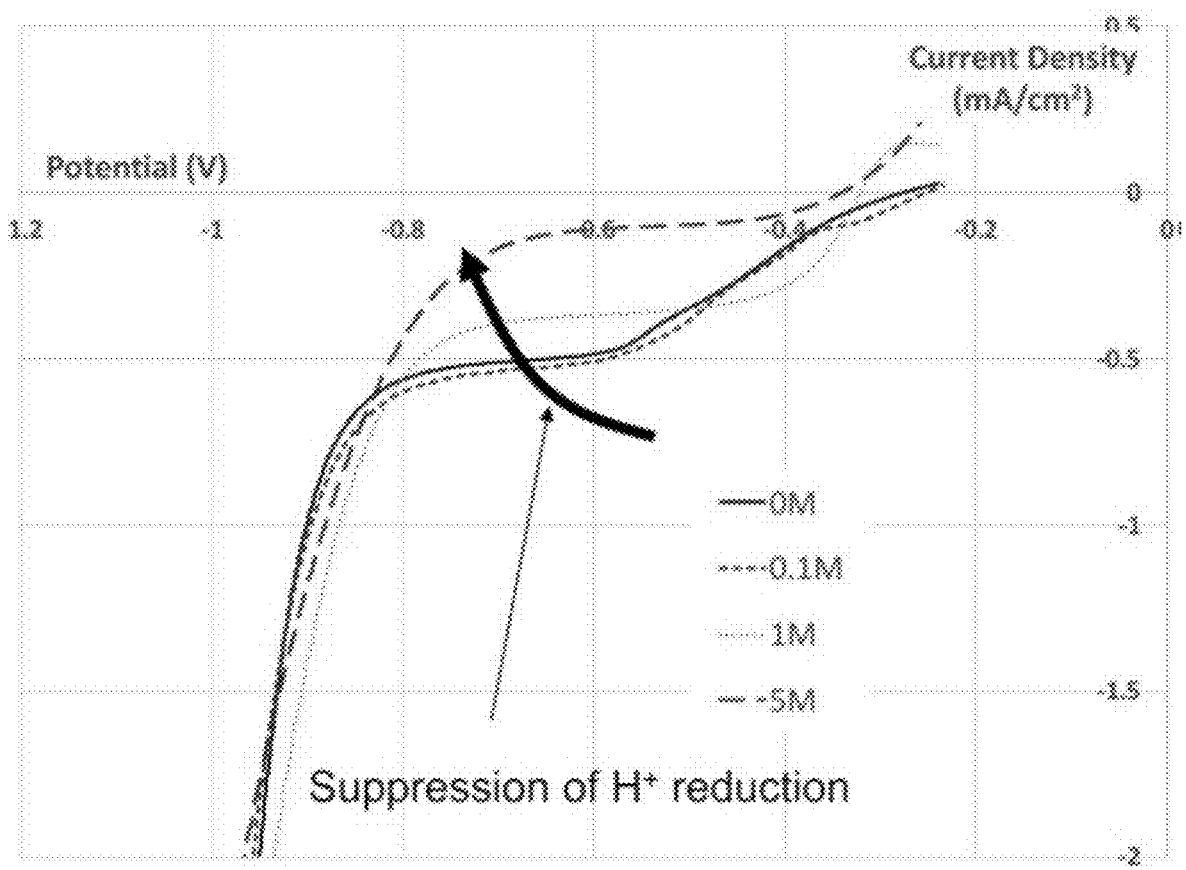
FIG. 13 shows the suppression of H$^+$ reduction during electrodeposition of Ni from an acidic (pH=4) Ni electrolyte when the electrolyte included 1 M LiCl or 5 M LiCl.
Figure 14:
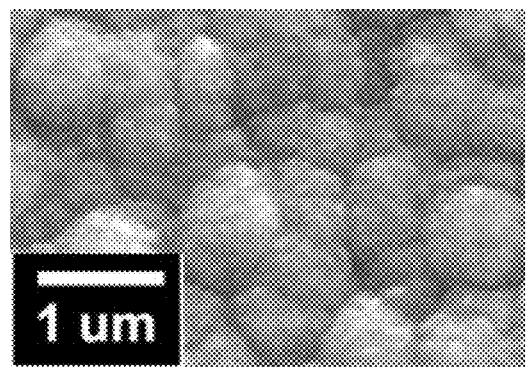
FIG. 14 is a SEM image of a Ni film deposited from the electrolyte without LiCl.
Figure 15:
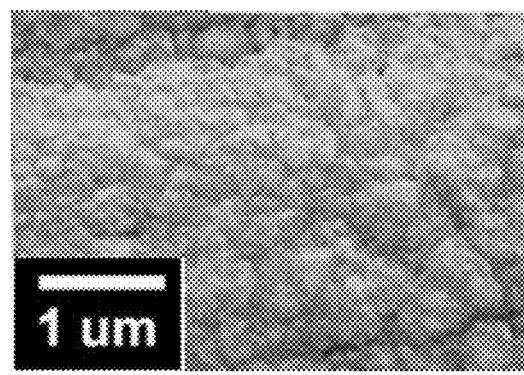
FIG. 15 is a SEM image of a Ni film deposited from the electrolyte including 5 M LiCl.
Figure 16:
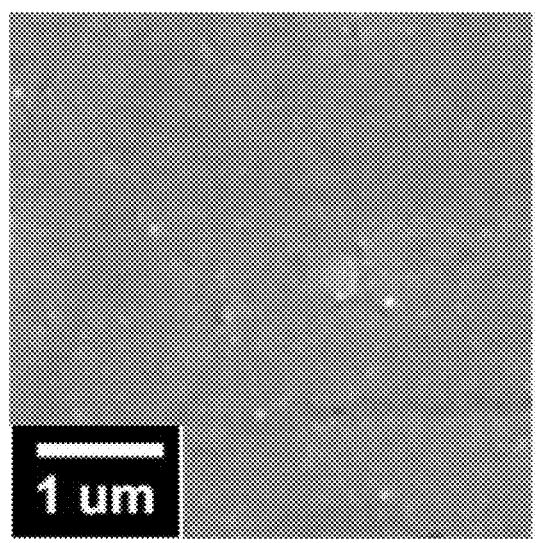
FIG. 16 is a SEM image of a Ni film deposited from the electrolyte including 10 M LiCl.

Example electrolyte solutions comprising 0.01 M nickel sulfate ($NiSO_4$), 0.01 M $H_2SO_4$, 0.3 M boric acid ($H_3BO_3$), and LiCl with concentration varying from 0 M to 10 M is described herein. Suppression of $H^+$ reduction during electrodeposition of Ni the electrolyte was observed when the electrolyte included 1 M LiCl or 5 M LiCl (FIG. 13). FIG. 14-FIG. 16 show the morphology of the Ni film deposited from the Ni electrolyte as the concentration of LiCl increased from 0 M to 5 M to 10 M.

Example 5

Zn Electrolyte

Figure 17:
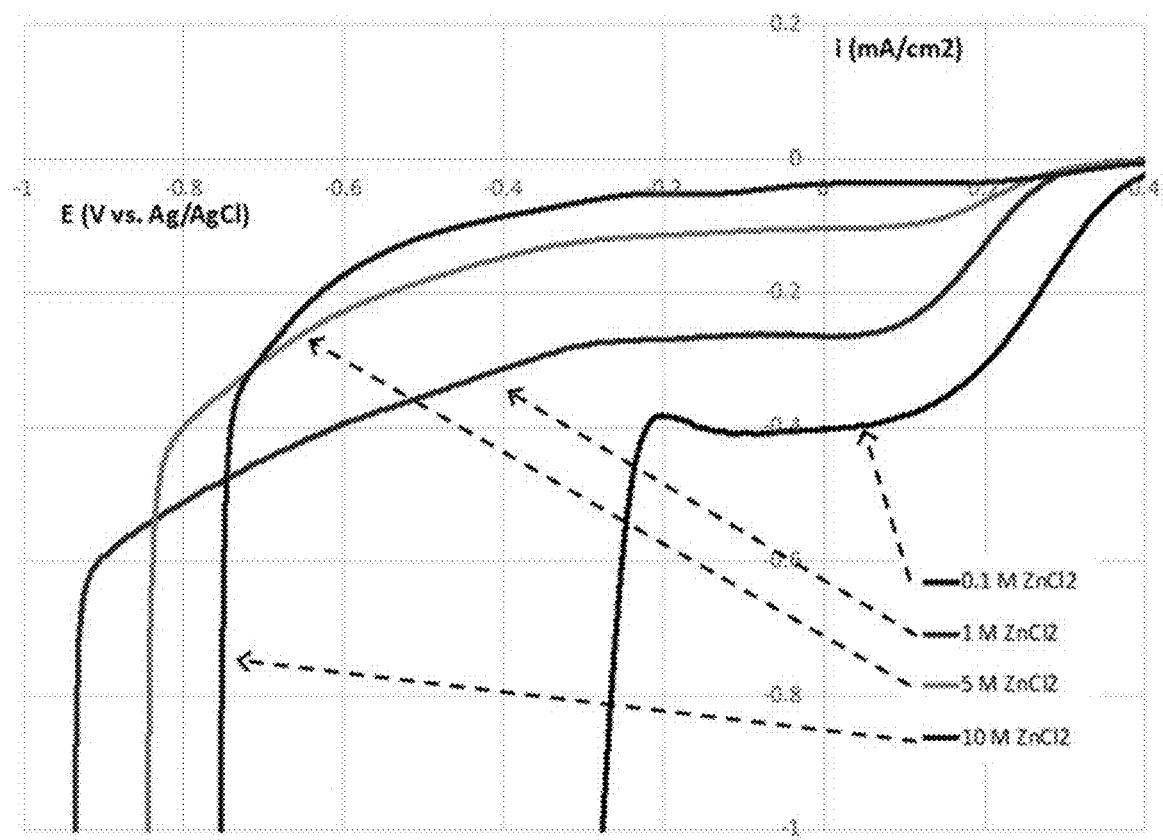
FIG. 17 shows the suppression of H$^+$ reduction when the electrolyte comprises ZnCl$_2$ with a concentration of 1 M or more.

Example electrolyte solutions comprising 0.01 M $H_2SO_4$ and varying concentrations of zinc chloride ($ZnCl_2$) from 0.1 M to 10 M are described herein. In this example, the solvate and the salt are the same species (e.g., $ZnCl_2$). FIG. 17 shows the suppression of $H^+$ reduction during electrodeposition of Zn from the Zn electrolyte as the $ZnCl_2$ concentration increased from 0.1 M to 1 M to 5 M to 10 M.

Example 6

Co Electrolyte

Figure 18:
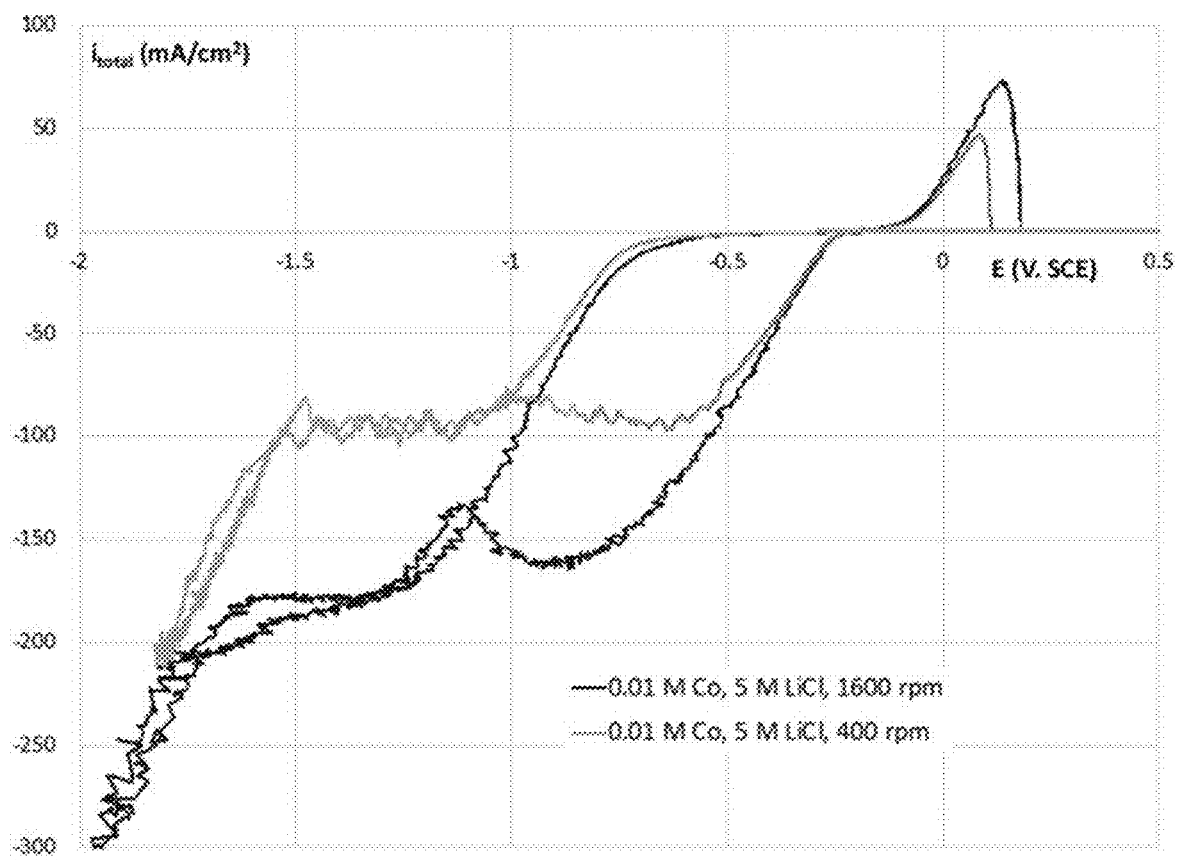
FIG. 18 shows the cyclic voltammogram of the Co electrolyte with 0.01 M CoSO$_4$ and 5 M LiCl on Pt RDE at 400 rpm and 1600 rpm.

Example electrolyte solutions comprising 0.1 M $H_2SO_4$, varying concentrations of $CoSO_4$ from 0.001 to 0.1 M, and varying concentrations of LiCl from 1 M to 10 M are described herein. FIG. 18 shows the cyclic voltammogram of the Co electrolyte with 0.01 M $CoSO_4$ and 5 M LiCl on Pt RDE. Suppressed maximum proton reduction current at −100 mA/cm² and −200 mA/cm² were observed at 400 and 1600 rpm, respectively, with 5 M LiCl. Metallic Co films were obtained from this electrolyte. A shift of the starting potential of proton reduction from −0.24 V to −0.75 V was observed sur to the change of electrode surface properties from Pt to Co.

Example 7

ReCo Electrolyte

Figure 19:
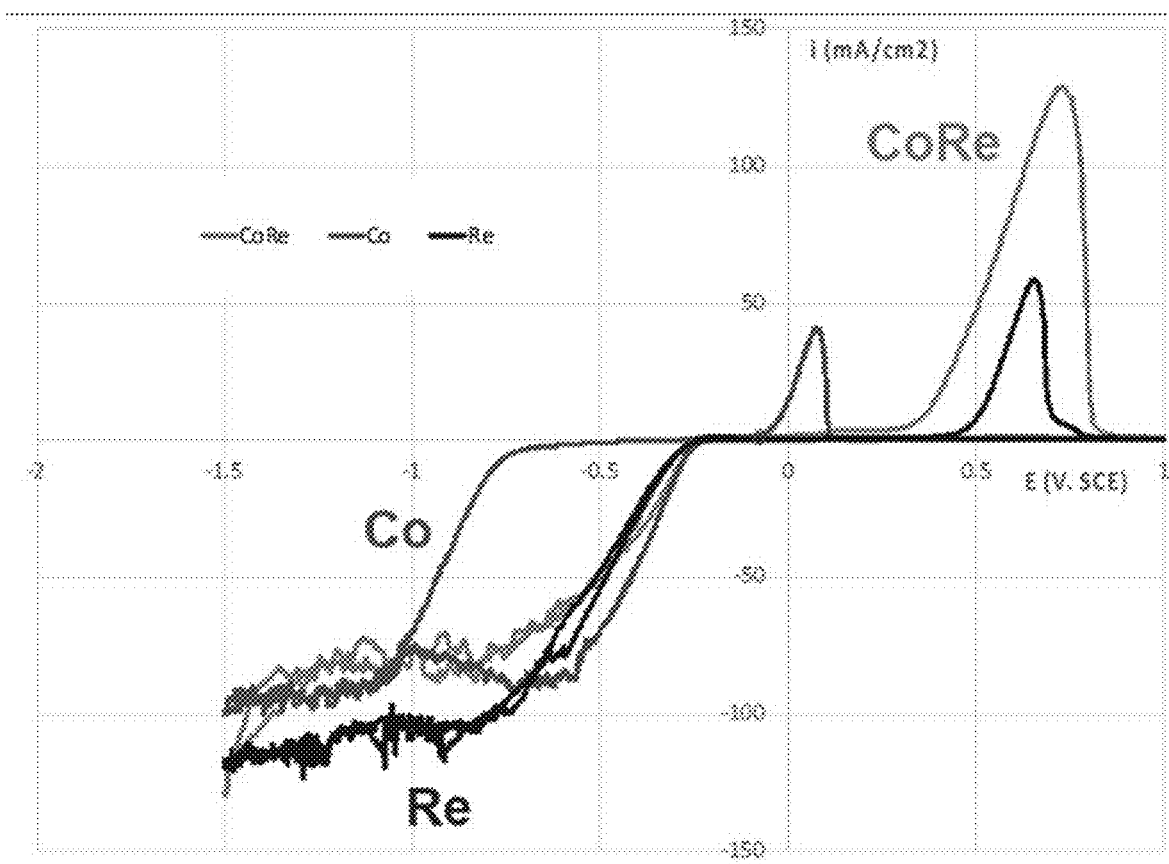
FIG. 19 shows the cyclic voltammogram of the ReCo electrolyte with 0.01 M CoSO$_4$ and 5 M LiCl on Pt RDE in comparison with the cyclic voltammogram of the Re electrolyte and Co electrolyte with the same concentration of NH$_4$ReO$_4$ or CoSO$_4$.
Figure 20:
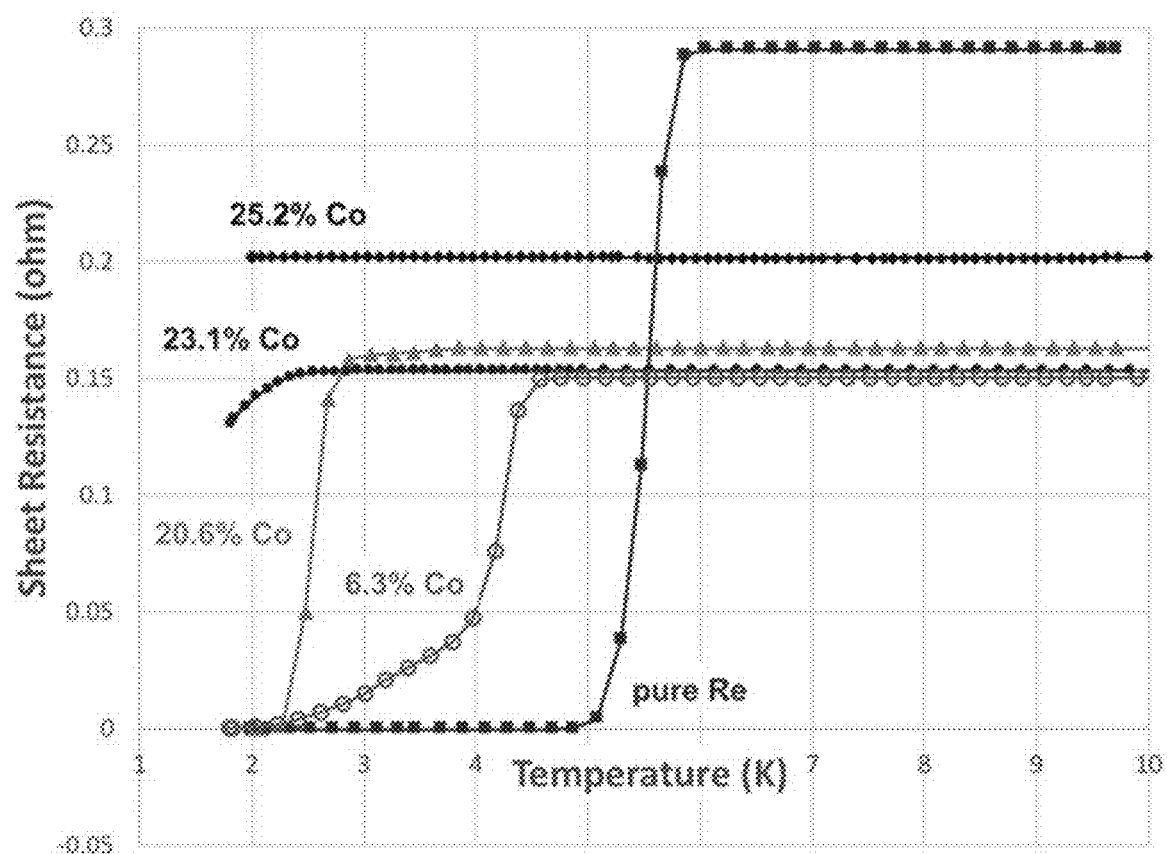
FIG. 20 shows the four-point resistance measurements along the strip with the temperature decreasing from 10 K to 1.8 K for pure Re and four different ReCo films.

Example electrolyte solutions comprising 0.1 $H_2SO_4$, 0.025 M $NH_4ReO_4$, varying concentrations of $CoSO_4$ from 0.001 to 0.01 M, and varying concentrations of LiCl from 1 M to 10 M are described herein. FIG. 19 shows the cyclic voltammogram of the ReCo electrolyte with 0.01 M $CoSO_4$ and 5 M LiCl on Pt RDE in comparison with the cyclic voltammogram of the Re electrolyte and Co electrolyte with the same concentration of $NH_4ReO_4$ or $CoSO_4$. The same suppressed maximum proton reduction current at −100 mA/cm² was observed at 400 rpm with 5 M LiCl. A synergistic interaction between Re and Co resulting in a faster metal deposition rate was observed as the anodic stripping peak in the ReCo electrolyte was much bigger than the sum of the two stripping peaks in the Re electrolyte and Co electrolyte. ReCo films with compositions of from 1% to 80% Co, preferably 3% to 30% Co can be deposited from these electrolytes. ReCo films were electrodeposited on silicon substrates with 1 mm wide Au strips. FIG. 20 shows the four-point resistance measurements along the strip with the temperature decreasing from 10 K to 1.8 K for pure Re and four different ReCo films. Superconductivity critical temperatures were found to depend on the alloy composition.

Example 8

Fe and ReFe Electrolytes

Example electrolyte solutions comprising 0.1 $H_2SO_4$, 5 M LiCl, and 0.001 to 0.1 M $FeSO_4$ can be used to deposit pure Fe films, using the rotation rates, current densities, and other conditions described in previous examples.

Example electrolyte solutions comprising 0.1 $H_2SO_4$, 5 M LiCl, 0.025 M $NH_4ReO_4$, and 0.001 to 0.5 M $FeSO_4$ can be used to deposit ReFe films using the rotation rates, current densities, and other conditions described in previous examples. The alloy compositions vary from 2% Fe to 80% Fe.

Example 9

Re Electrolytes Containing Organic Additives

Example electrolyte solutions comprising 0.1 $H_2SO_4$, 5 M LiCl, 0.025 M $NH_4ReO_4$, and 0 to 200 ppm thiourea can be used to deposit pure Re films with sulfur inclusion. Electrolytes comprising other organic molecules that comprise elements such as sulfur, oxygen, nitrogen, phosphorus, and other non-metallic elements can be used to deposit pure Re or Re alloys with the incorporation of these elements. The organic molecules include tetrabutylammonium chloride, tetraethylammonium sulfate, choline chloride, polyethyleneimine, polyethylene glycol, dioxime, dimethyl glyoxime, mercapto-propylsulfonate, saccharin, thiourea.

Example 10

Fructose Electrolyte

Figure 21:
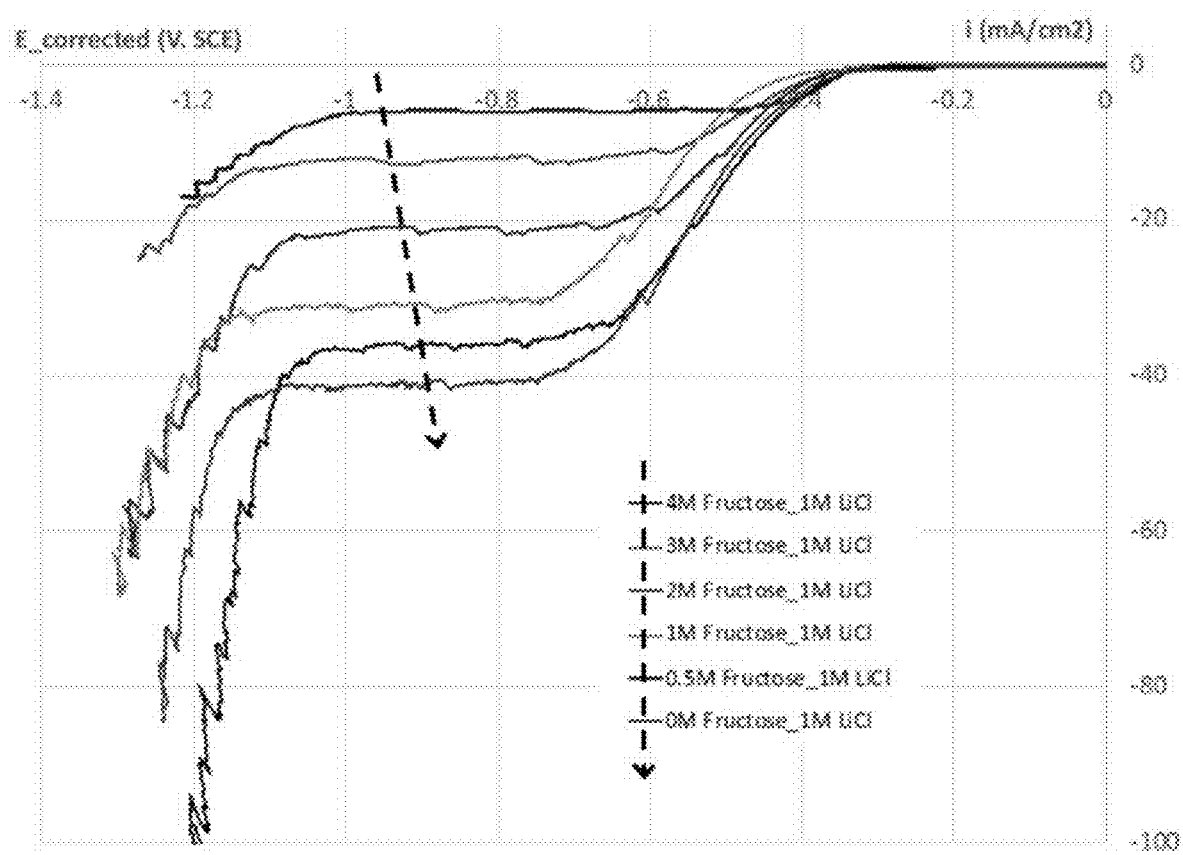
FIG. 21 shows the suppression of H$^+$ reduction when the electrolyte comprises fructose with a concentration of 0.5 M or more.

Example electrolyte solutions comprising 0.01 M sulfuric acid ($H_2SO_4$), 1 M LiCl, and varying concentrations of fructose from 0 M to 4 M are described herein. FIG. 21 shows the suppression of $H^+$ reduction from the fructose electrolyte as the fructose concentration increased from 0 M to 4 M.

Example 11

This disclosure relates to methods where an electrolyte with a high concentration of a solvate is used. Such solvates include 1) salts of alkali metals salts such lithium, sodium, potassium, rubidium, cesium; 2) salts of alkaline earth metals such as magnesium, calcium, strontium, barium; and/or 3) organic compounds such as choline, ammonia, imine, imide, fructose, glucose, sucrose. The concentration of these solvates are higher than 1 M, preferably higher than 2 M, more preferably higher than 5 M, even more preferably higher than 10 M.

The hydration of a high concentration of the solvate decreases the amount of free water molecules in the electrolyte by restricting water molecules around the solvate molecules. Therefore, while the solution retains many of the advantages of aqueous solutions for electroplating, the scarcity of free water molecules suppresses the hydrogen evolution reaction. This helps to 1) improve the power consumption, 2) decrease the hydrogen incorporation in the deposited materials, 3) improve the morphology of materials, 4) improve the control of properties of materials.

For example, the methods described herein can be used to electroplate Al, Si, Ti, V, Cr, Mn, Fe, Co, Ni, Cu, Zn, Ga, Ge, As, Se, Zr, Nb, Mo, Tc, Ru, Rh, Pd, Ag, Cd, In, Sn, Sb, Te, Ta, W, Re, Os, Ir, Pt, Au, Hg, Tl, Pb, Bi, and combinations thereof, including alloys and compounds thereof. One embodiment can be electroplating of Re from a solution containing 5 M LiCl. Other embodiments can include electroplating of ReMo, ReW, ReRu, PdZn, FeCoMn, FeCoSe, NiFeSe, GaAs, CuInGa, CuInGaSe.

The methods described herein can be used to fabricate materials for numerous applications, including coating, electronics, microdevices, aerospace, and national defense applications.

Example 12

Deposition of Layered Structures

Two example electrolytes solutions, the first comprising 0.1 $H_2SO_4$, 5 M LiCl, and 0.025 M $NH_4ReO_4$, and the second comprising 0.1 $H_2SO_4$, 5 M LiCl, and 0.025 M $FeSO_4$, can be used separately to deposit pure Re and pure Fe layers.

Two example electrolytes solutions, the first comprising 0.1 $H_2SO_4$, 5 M LiCl, and 0.025 M $NH_4ReO_4$, and the second comprising 0.1 $H_2SO_4$, 5 M LiCl, and 0.05 M $(NH_4)_2MoO_4$, can be used separately to deposit pure Re and pure Mo layers.

The deposited layers of Re and Fe or of Re and Mo can be annealed at temperatures between 100 to 2000° C. to inter-diffuse the layers and to produce ReFe and ReMo alloys.

Example 13

Methods for electrodeposition using an aqueous electrolyte comprising a solvate are described herein. The methods can suppress the reaction of water during electroplating without sacrificing the benefits of using aqueous electrolyte solutions as hydration of the solvate reduces free water molecules.

Candidate solvates have a high solubility, high coordinate number with water molecules, strong interaction with water molecules, do not consume electrons in the potential of interest, do not result in deposition in the potential of interest, are affordable, or a combination thereof. For example, salts with a ΔG lower than that of $Li^+$ and $Cl^-$ are candidate solvates.

The deposited Re film from the electrolyte without LiCl exhibited cracks, while the Re film deposited from the electrolyte including 5 M LiCl did not exhibit cracks.

The methods and compositions of the appended claims are not limited in scope by the specific methods and compositions described herein, which are intended as illustrations of a few aspects of the claims and any methods and compositions that are functionally equivalent are within the scope of this disclosure. Various modifications of the methods and compositions in addition to those shown and described herein are intended to fall within the scope of the appended claims. Further, while only certain representative methods, compositions, and aspects of these methods and compositions are specifically described, other methods and compositions and combinations of various features of the methods and compositions are intended to fall within the scope of the appended claims, even if not specifically recited. Thus a combination of steps, elements, components, or constituents can be explicitly mentioned herein; however, all other combinations of steps, elements, components, and constituents are included, even though not explicitly stated.

What is claimed is:

1. A method of electrodeposition, the method comprising:
applying an electric potential to a working electrode,
wherein the working electrode is in electrochemical contact with an aqueous electrolyte and the aqueous electrolyte is further in electrochemical contact with a counter electrode;
wherein the aqueous electrolyte comprises a solvate, a salt, and water;
wherein the solvate comprises an alkali metal salt, an alkaline earth metal salt, an organic compound, or a combination thereof;
wherein a fully hydrated solution of the solvate in water has a first molar ratio of water to solvate;
wherein the aqueous electrolyte has a second molar ratio of water to solvate, and the second molar ratio is less than the first molar ratio, such that the aqueous electrolyte has a decreased number of free water molecules than the corresponding fully hydrated solution of the solvate in water;
wherein the salt comprises a metal, a metalloid, a nonmetal, or a combination thereof;
wherein the solvate and the salt are different; and
wherein the solvate has a lower reduction potential than the salt;
thereby reducing at least a portion of the salt in the aqueous electrolyte and electrodepositing a layer comprising the metal, the metalloid, the nonmetal, or combination thereof; and
wherein the method has a suppressed $H^+$ reduction compared to the corresponding method performed using the fully hydrated solution of the solvate in water due to the decreased number of free water molecules in the aqueous electrolyte compared to the corresponding fully hydrated solution of the solvate in water.

2. The method of claim 1, wherein the solvate comprises an alkali metal salt comprising an alkali metal selected from the group consisting of lithium, sodium, potassium, rubidium, cesium, and combinations thereof.

3. The method of claim 1, wherein the solvate comprises an alkaline earth metal salt comprising an alkaline earth metal selected from the group consisting of magnesium, calcium, strontium, barium, and combinations thereof.

4. The method of claim 1, wherein the solvate comprises an organic compound comprising an element selected from the group consisting of sulfur, oxygen, nitrogen, phosphorous, other non-metallic elements, and combinations thereof.

5. The method of claim 1, wherein the solvate comprises an organic compound selected from the group consisting of choline, ammonia, an ammonium salt, imine, imide, fructose, glucose, sucrose, and combinations thereof.

6. The method of claim 1, wherein the solvate comprises ammonium acetate, ammonium chloride, ammonium formate, ammonium nitrate, ammonium thiocyanate, tetrabutylammonium chloride, tetrabutylammonium sulfate, cesium acetate, cesium chloride, cesium formate, calcium chloride, indium chloride, lithium acetate, lithium chloride (LiCl), lithium formate, lithium thiocyanate, lithium bis(trifluoromethane sulfonyl) imide (LiTFSI), potassium acetate, potassium chloride, potassium thiocyanate, sodium chloride, sodium formate, zinc chloride, choline chloride, fructose, glucose, mannose, sucrose, xylose, urea, thiourea, polyethyleneimine, polyethylene glycol, dioxime, dimethyl glyoxime, mercapto-propylsulfonate, saccharin, or a combination thereof.

7. The method of claim 1, wherein the concentration of the solvate is 5 moles per liter (M) or more.

8. The method of claim 1, wherein the metal, the metalloid, the nonmetal, or combination thereof comprising the salt is/are selected from the group consisting of Al, Si, Ti, V, Cr, Mn, Fe, Co, Ni, Cu, Zn, Ga, Ge, As, Se, Zr, Nb, Mo, Tc, Ru, Rh, Pd, Ag, Cd, In, Sn, Sb, Te, Ta, W, Re, Os, Ir, Pt, Au, Hg, Tl, Pb, Bi, and combinations thereof.

9. The method of claim 1, wherein the metal, the metalloid, the nonmetal, or combination thereof comprising the salt is/are selected from the group consisting Re, W, Ru, Pd, Zn, Fe, Co, Mn, Se, Ni, Ga, As, Cu, In, Sn, Si, Ge, and combinations thereof.

10. The method of claim 1, wherein the salt has a concentration in the aqueous electrolyte of from 0.001 M to 1 M.

11. The method of claim 1, wherein the electrodeposited layer comprises Re, Mn, Nb, Si, Ge, Ga, Mo, Ru, ReW, ReRu, ReMn, ReFe, ReCo, ReNi, ReMo, PdZn, RuFe, RuCo, RuNi, RuMo, FeMn, CoMn, NiFeMo, FeCoMn, FeCoSe, NiFeSe, GaAs, CuInGa, CuInGaSe, or combinations thereof.

12. The method of claim 1, wherein the electrodeposited layer has a lower amount of hydrogen incorporated therein, an improved morphology, an improved property, or a combination thereof compared to the corresponding electrodeposited layer resulting from the corresponding method performed using the fully hydrated solution of the solvate in water.

13. A sample comprising the electrodeposited layer made using the method of claim 12.

14. The sample of claim 13, wherein the electrodeposited layer exhibits superconductivity.

15. A method of use of the sample of claim 13, the method of use comprising using the sample as a coating, in an electronic device, in a microdevice, in an aerospace device, or a combination thereof.

16. The method of claim 1, wherein the aqueous electrolyte further comprises an additional solvent, wherein the additional solvent comprises ethanol, isopropanol, ethylene glycol, polyethylene glycol, glycerol, alkane diol, or combinations thereof.

17. The method of claim 1, wherein the applied electric potential is from −3 volts (V) to −0.2 V.

18. The method of claim 1, further comprising annealing the electrodeposited layer at a temperature of from 100° C. to 2000° C.

* * * * *